(12) United States Patent
Lee et al.

(10) Patent No.: US 12,489,060 B2
(45) Date of Patent: Dec. 2, 2025

(54) SEMICONDUCTOR PACKAGE

(71) Applicant: Samsung Electronics Co., Ltd., Suwon-si (KR)

(72) Inventors: Jaeean Lee, Suwon-si (KR); Dahee Kim, Suwon-si (KR); Taehoon Lee, Suwon-si (KR); Gyujin Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 378 days.

(21) Appl. No.: 18/203,239

(22) Filed: May 30, 2023

(65) Prior Publication Data
US 2024/0063131 A1    Feb. 22, 2024

(30) Foreign Application Priority Data

Aug. 16, 2022    (KR) ........................ 10-2022-0102230

(51) Int. Cl.
*H01L 25/18*    (2023.01)
*H01L 23/00*    (2006.01)
(Continued)

(52) U.S. Cl.
CPC .......... *H01L 23/5385* (2013.01); *H01L 24/19* (2013.01); *H01L 24/20* (2013.01);
(Continued)

(58) Field of Classification Search
CPC . H10B 80/00; H01L 21/4857; H01L 21/6835; H01L 2221/68345; H01L 2221/68359; H01L 2224/16227; H01L 2224/19; H01L 2224/211; H01L 2224/2919; H01L 2224/29194; H01L 2224/2929; H01L 2224/32221; H01L 2224/32225; H01L 2224/33181; H01L 2224/73204; H01L 2224/73267; H01L 2225/06548; H01L 2225/06589; H01L 23/13; H01L 23/3128; H01L 23/36; H01L 23/49816; H01L 23/5383; H01L 23/5384; H01L 23/5385; H01L 23/5389;
(Continued)

(56) References Cited

U.S. PATENT DOCUMENTS 8,946,900 B2    2/2015   Qian et al.
10,217,710 B2   2/2019   Lin et al.
(Continued)

FOREIGN PATENT DOCUMENTS

KR   10-2020-0132511 A    11/2020

*Primary Examiner* — Edward Chin
(74) *Attorney, Agent, or Firm* — Sughrue Mion, PLLC

(57) ABSTRACT

A semiconductor package includes a first substrate having a first surface and a second surface, and having a cavity extending from the first surface to the second surface in a vertical direction, a first chip disposed in the cavity of the first substrate, a redistribution structure on the first surface of the first substrate, a second chip on the redistribution structure, a third chip spaced apart from the second chip in a horizontal direction and disposed on the redistribution structure, and a bridge chip embedded in the redistribution structure, wherein the redistribution structure includes a first redistribution pattern, a second redistribution pattern, and a third redistribution pattern.

20 Claims, 25 Drawing Sheets

(51) Int. Cl.
 *H01L 23/31* (2006.01)
 *H01L 23/538* (2006.01)
 *H01L 25/00* (2006.01)
 *H10B 80/00* (2023.01)

(52) U.S. Cl.
 CPC .............. *H01L 24/29* (2013.01); *H01L 24/32* (2013.01); *H01L 25/18* (2013.01); *H01L 25/50* (2013.01); *H10B 80/00* (2023.02); *H01L 23/3128* (2013.01); *H01L 24/16* (2013.01); *H01L 24/33* (2013.01); *H01L 24/73* (2013.01); *H01L 2224/16227* (2013.01); *H01L 2224/19* (2013.01); *H01L 2224/211* (2013.01); *H01L 2224/2919* (2013.01); *H01L 2224/29194* (2013.01); *H01L 2224/2929* (2013.01); *H01L 2224/32221* (2013.01); *H01L 2224/32225* (2013.01); *H01L 2224/33181* (2013.01); *H01L 2224/73204* (2013.01); *H01L 2224/73267* (2013.01); *H01L 2924/0665* (2013.01); *H01L 2924/1431* (2013.01); *H01L 2924/1432* (2013.01); *H01L 2924/14335* (2013.01); *H01L 2924/1436* (2013.01); *H01L 2924/1437* (2013.01); *H01L 2924/1441* (2013.01); *H01L 2924/1443* (2013.01)

(58) Field of Classification Search
 CPC ......... H01L 24/16; H01L 24/19; H01L 24/20; H01L 24/29; H01L 24/32; H01L 24/33; H01L 24/73; H01L 25/0652; H01L 25/18; H01L 25/50; H01L 2924/0665; H01L 2924/1431; H01L 2924/1432; H01L 2924/14335; H01L 2924/1436; H01L 2924/1437; H01L 2924/1441; H01L 2924/1443

See application file for complete search history.

(56) References Cited

U.S. PATENT DOCUMENTS

| | | |
|---|---|---|
| 10,461,047 B2 | 10/2019 | Kim et al. |
| 11,081,448 B2 | 8/2021 | Pietambaram et al. |
| 11,088,080 B2 | 8/2021 | Tsai et al. |
| 2020/0105719 A1 | 4/2020 | Li et al. |
| 2021/0028080 A1 | 1/2021 | Pietambaram et al. |
| 2021/0082819 A1 | 3/2021 | Wu et al. |
| 2021/0375741 A1 | 12/2021 | Tsou et al. |
| 2021/0375773 A1* | 12/2021 | Lee ............ H01L 23/433 |
| 2022/0310577 A1* | 9/2022 | Lee ............ H01L 23/5389 |
| 2022/0359358 A1* | 11/2022 | Kim ............ H01L 23/3107 |
| 2022/0406751 A1* | 12/2022 | Elsherbini ............ H01L 24/92 |
| 2023/0057113 A1* | 2/2023 | Tsai ............ H01L 24/73 |
| 2023/0065380 A1* | 3/2023 | Cheah ............ H01L 25/50 |
| 2023/0307307 A1* | 9/2023 | Horibe ............ H01L 24/16 |
| 2023/0307337 A1* | 9/2023 | Chen ............ H01L 24/32 |

* cited by examiner

SEMICONDUCTOR PACKAGE

CROSS-REFERENCE TO RELATED APPLICATION

This application claims priority to Korean Patent Application No. 10-2022-0102230, filed on Aug. 16, 2022, in the Korean Intellectual Property Office, the disclosure of which is incorporated by reference herein in its entirety.

BACKGROUND

The disclosure relates to a semiconductor package, and more particularly, to a highly integrated semiconductor package.

Demand for portable devices has been rapidly increasing. Accordingly, the electronics product market has sought continuous miniaturization and weight reduction of electronic components mounted in these electronic products. In order to accomplish miniaturization and weight reduction of electronic components, a semiconductor package that can process high-capacity data while having small volume may be useful.

SUMMARY

The disclosure provides a semiconductor package with high integration and improved heat dissipation effect.

According to aspects of an example embodiment, a semiconductor package includes: a first substrate having a first surface and a second surface opposite to the first surface, comprising a wiring pattern, and having a cavity extending from the first surface to the second surface in a vertical direction; a first chip in the cavity of the first substrate; a redistribution structure on the first surface of the first substrate; a second chip on an upper surface of the redistribution structure; a third chip spaced apart from the second chip in a horizontal direction and disposed on an upper surface of the redistribution structure; and a bridge chip embedded in the redistribution structure and electrically connecting the second chip and the third chip, wherein the redistribution structure comprises: first redistribution pattern electrically connecting the wiring pattern to the second chip, and electrically connecting the wiring pattern to the third chip; a second redistribution pattern electrically connecting the bridge chip to the second chip, and electrically connecting the bridge chip to the third chip; and a third redistribution pattern electrically connected to the first chip.

According to an aspect of an example embodiment, a semiconductor package includes: a first substrate having a first surface and a second surface opposite to the first surface, comprising a wiring pattern and a wiring insulating layer surrounding the wiring pattern, and having a cavity extending from the first surface to the second surface in a vertical direction; a first chip disposed in the cavity of the first substrate; a first molding member covering the second surface of the first substrate, the cavity, and the first chip; a redistribution structure disposed on the first surface of the first substrate and an upper surface of the first molding member, and comprising a redistribution pattern and a redistribution insulating layer surrounding the redistribution pattern; a second chip disposed on the upper surface of the redistribution structure; a third chip disposed on the upper surface of the redistribution structure; a second molding member surrounding the second chip and the third chip on the upper surface of the redistribution structure; and a bridge chip embedded in the redistribution structure and electrically connecting the second chip to the third chip.

According to an aspect of an example embodiment, a semiconductor package includes: a first substrate having a first surface and a second surface opposite to the first surface, comprising a wiring pattern and a wiring insulating layer surrounding the wiring pattern, and a cavity extending from the first surface to the second surface in a vertical direction; a first chip in the cavity of the first substrate; a first molding member covering the second surface of the first substrate, the cavity, and a sidewall of the first chip, and comprising a first opening exposing a lower surface of the first chip; a redistribution structure on the first surface of the first substrate and an upper surface of the first molding member, and comprising a redistribution pattern and a redistribution insulating layer surrounding the redistribution pattern; a second chip on the upper surface of the redistribution structure; a third chip on the upper surface of the redistribution structure; a second molding member surrounding sidewalls of the second chip and the third chip, and having an upper surface positioned on a same plane as an upper surface of the second chip and an upper surface of the third chip; a first heat dissipation member attached to a lower surface of the first chip through the first opening; a second heat dissipation member positioned on an upper surface of the second chip, an upper surface of the third chip, and an upper surface of the second molding member; and a bridge chip embedded in the redistribution structure and electrically connecting the second chip to the third chip, wherein the redistribution structure comprises: a first redistribution pattern electrically connecting the wiring pattern to the second chip and the third chip; a second redistribution pattern electrically connecting the bridge chip to the second chip and the third chip; and a third redistribution pattern electrically connected to the first chip.

BRIEF DESCRIPTION OF DRAWINGS

Embodiments of the inventive concept will be more clearly understood from the following detailed description taken in conjunction with the accompanying drawings in which.

DETAILED DESCRIPTION OF EMBODIMENTS

Figure 1:
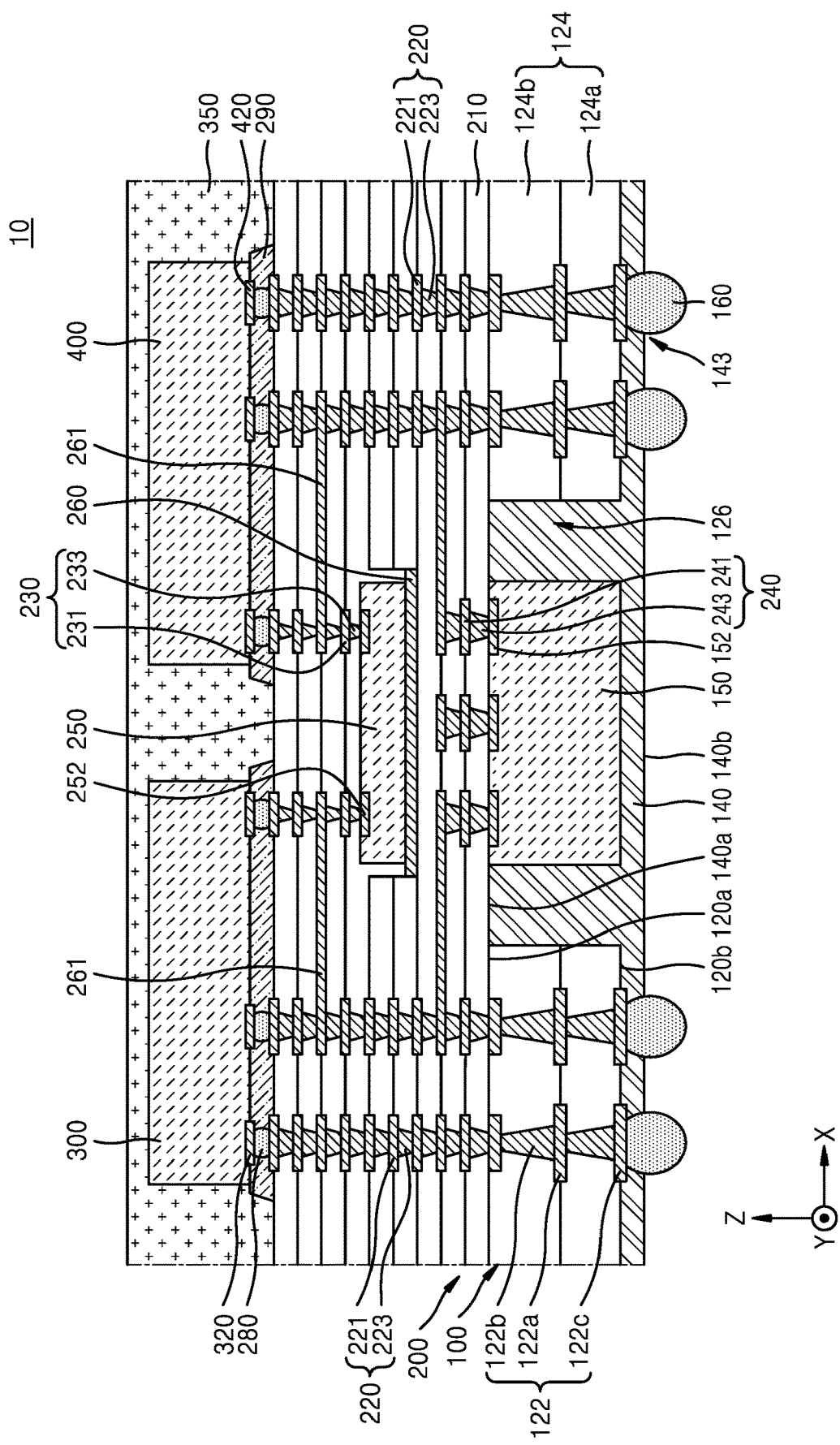
FIG. 1 is a cross-sectional view illustrating a semiconductor package according to an example embodiment.

Example embodiments will be described more fully with reference to the accompanying drawings. Embodiments described herein are example embodiments, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. The same reference numerals are used for the same components in the drawings, and duplicate descriptions thereof are omitted.

FIG. 1 is a cross-sectional view illustrating a semiconductor package according to an embodiment.

Referring to FIG. 1, a semiconductor package 10 according to an embodiment may include a first substrate 100, a redistribution structure 200, a first molding member 140, and a second molding member 350. Also, the semiconductor package 10 may include a first chip 150, a second chip 300, a third chip 400, and a bridge chip 250 mounted in the semiconductor package 10.

The first substrate 100 may have a first surface 120a and a second surface 120b opposite to the first surface 120a. The first surface 120a may be a surface facing the redistribution structure 200 in the first substrate 100, and may be understood as an upper surface of the first substrate 100. The second surface 120b may be a surface opposite to the first surface 120a of the first substrate 100, and may be understood as a lower surface of the first substrate 100. At least one of the first surface 120a and the second surface 120b may be flat. The first substrate 100 may include layers stacked on each other in the vertical direction Z.

In the following drawings, the first surface 120a of the first substrate 100 may have the same meaning as the upper surface of the first substrate 100, and the second surface 120b of the first substrate 100 may have the same meaning as the lower surface of the first substrate 100.

The X-axis direction and the Y-axis direction are parallel to the upper surface and lower surface of the first substrate 100. The X-axis direction and the Y-axis direction may be perpendicular to each other. The Z-axis direction may be perpendicular to the upper surface or the lower surface of the first substrate 100. In other words, the Z-axis direction may be a direction perpendicular to the X-Y plane.

In addition, in the following drawings, the first horizontal direction may be understood as an X-axis direction, the second horizontal direction may be understood as a Y-axis direction, and the vertical direction may be understood as a Z-axis direction.

The first substrate 100 may be a cavity substrate on which the first chip 150 is mounted. In embodiments, the first substrate 100 may be a coreless substrate formed by an embedded trace substrate (ETS) method. In this case, the first substrate 100 may include a plurality of insulating layers and circuit layers in the insulating layers. In an embodiment, the first substrate 100 may include a core multilayer substrate. In this case, the first substrate 100 may include a core layer and circuit layers stacked on both sides of the core layer. According to example embodiments, the first substrate 100 may be a printed circuit board (PCB).

The first substrate 100 may include a cavity 126, a wiring insulating layer 124, and a wiring pattern 122 formed in the wiring insulating layer 124. The cavity 126 may be a mounting space for mounting the first chip 150 in the first substrate 100. According to example embodiments, the cavity 126 may be a hole extending from the first surface 120a to the second surface 120b of the first substrate 100. The cavity 126 may be formed in a particular region, for example, a central region, of the first substrate 100 on which the first chip 150 is mounted. That is, the first substrate 100 may include a cavity 126 penetrating the first substrate 100 in the vertical direction Z, and the first chip 150 may be accommodated in the cavity 126 of the first substrate 100. According to example embodiments, a plurality of cavities 126 may be formed in the first substrate 100.

The first chip 150 may be accommodated in the cavity 126 of the first substrate 100. In example embodiments, the first chip 150 may be a semiconductor chip. The first chip 150 may be a logic chip, a memory chip, or a bridge chip. The memory chip may be, for example, a volatile memory chip such as a dynamic random access memory (DRAM) or a static random access memory (SRAM), or may be a non-volatile memory chip such as a phase-change random access memory (PRAM), a magnetoresistive random access memory (MRAM), a ferroelectric random access memory (FeRAM), or a resistive random access memory (RRAM). The logic chip may be, for example, a microprocessor such as a central processing unit (CPU), a graphics processing unit (GPU), or an application processor (AP), an analog device, or a digital signal processor.

The first chip 150 may include an upper surface adjacent to the active surface of the semiconductor substrate and a lower surface opposite to the upper surface. The first chip may include a first chip pad 152 attached to the upper surface. According to example embodiments, the first chip 150 may be mounted in the first substrate 100 such that an upper surface of the first chip 150 faces the redistribution structure 200. According to example embodiments, the upper surface of the first chip 150 and the first surface 120a of the first substrate 100 may be on the same plane. According to example embodiments, the first chip 150 may be mounted in the first substrate 100 such that the first chip pad 152 faces the redistribution structure 200.

The wiring insulating layer 124 may include a plurality of insulating layers stacked in the vertical direction Z. For example, the wiring insulating layer 124 may include a first wiring insulating layer 124a and a first wiring insulating layer 124b stacked in the vertical direction Z. The first wiring insulating layer 124a is an insulating layer closest to the second surface 120b of the first substrate 100, that is, the lower surface of the first substrate 100, and may be the lowest insulating layer. The first wiring insulating layer 124b may be an insulating layer closest to the first surface 120a of the first substrate 100, that is, the upper surface of the first substrate 100, and may be an uppermost insulating layer.

In example embodiments, the wiring insulating layer 124 may include a prepreg. In addition, the wiring insulating layer 124 may be made of at least one material selected from phenol resin, epoxy resin, and polyimide. The wiring insulation layer 124 may include, for example, at least one material selected from among Flame Retardant 4 (FR-4), Tetrafunctional epoxy, Polyphenylene ether, Epoxy/polyphenylene oxide, Bismaleimide triazine (BT), Thermount, Cyanate ester, Polyimide, and Liquid crystal polymer.

In FIG. 1, the wiring insulating layer 124 is illustrated as being composed of insulating layers having a two-layer structure in the embodiment, but is not limited thereto, and the wiring insulating layer 124 may be composed of insulating layers having a multilayer structure of three or more layers.

The wiring pattern 122 may be formed to penetrate the first substrate 100 from the upper surface to the lower surface of the first substrate 100 and may be configured to serve as an electrical connection path. The wiring pattern 122 may electrically connect the redistribution structure 200 to the external connection bump 160. The wiring pattern 122 may electrically connect the first redistribution pattern 220 to the external connection bump 160. The wiring pattern 122 may be made of at least one of copper, nickel, stainless steel, and beryllium copper.

The wiring pattern 122 may include a wiring line pattern 122a, a wiring via pattern 122b, and a wiring pad 122c. The wiring pattern 122 may have a multilayer structure in which two or more wiring line patterns 122a or two or more wiring via patterns 122b are alternately stacked.

The wiring line pattern 122a may extend along at least one of the top and bottom surfaces of the first wiring insulating layer 124a and the first wiring insulating layer 124b. The wiring via pattern 122b may extend through at least one of the first wiring insulating layer 124a and the first wiring insulating layer 124b. The plurality of wiring via patterns 122b may electrically connect the wiring line patterns 122a positioned at different levels to each other in the vertical direction (e.g., the Z direction). For example, the plurality of wiring via patterns 122b may electrically connect a wiring line pattern formed in the first wiring insulating layer 124a to a wiring line pattern formed in the first wiring insulating layer 124b. Among the plurality of wiring line patterns 122a, the plurality of wiring line patterns provided on the lower surface of the first wiring insulating layer 124a, that is, the lower surface of the first substrate 100, may be the wiring pads 122c attached to the external connection bump 160.

In some example embodiments, at least a portion of the plurality of wiring line patterns 122a may be formed together with a portion of the plurality of wiring via patterns 122b to form an integral body.

The first molding member 140 may fill the cavity 126 of the first substrate 100 and surround the first chip 150. In some embodiments, the first molding member 140 may fill the cavity 126, cover the first chip 150, and cover the second surface 120b of the first substrate 100. In example embodiments, the upper surface of the first molding member 140 may be at the same vertical level as the first surface 120a, which is the upper surface of the first substrate 100. The upper surface of the first molding member 140 may be on the same plane as the upper surface of the first substrate 100. The upper surface of the first molding member 140 may be on the same plane as the upper surface of the first chip 150 and the upper surface of the first substrate 100.

In example embodiments, a lower surface of the first molding member 140 may have a planarized surface through a planarization process. In example embodiments, the lower surface of the first molding member 140 may be at a lower vertical level than the lower surface of the first substrate 100.

The first molding member 140 may be formed from a thermosetting resin such as an epoxy resin, a thermoplastic resin such as polyimide, or a resin including a reinforcing material such as an inorganic filler therein, specifically, Ajinomoto Build-up Film (ABF), FR-4, BT, and the like, but is not limited thereto, and the first molding member 140 may be formed of a molding material such as an epoxy mold compound (EMC) or a photosensitive material such as a photoimagable encapsulant (PIE). In some embodiments, a portion of the first molding member 140 may be formed of an insulating material such as a silicon oxide layer, a silicon nitride layer, or a silicon oxynitride layer.

The redistribution structure 200 may be provided on the upper surface of the first substrate 100. The redistribution structure 200 may be a redistribution substrate manufactured through a redistribution process. However, the redistribution structure 200 is not limited thereto, and in other embodiments, the redistribution structure 200 may be a package substrate on which a semiconductor package is mounted.

The redistribution structure 200 may include a redistribution insulating layer 210, a redistribution pattern, and a stopper metal layer 260. The redistribution pattern may include a first redistribution pattern 220, a second redistribution pattern 230, and a third redistribution pattern 240. The redistribution structure 200 may electrically connect the first substrate 100, the first to third chips 150, 300, and 400, and the bridge chip 250 to each other through the first to third redistribution patterns 220, 230, and 240.

The redistribution insulating layer 210 may include a plurality of insulating layers stacked in the vertical direction Z. A plurality of redistribution insulating layers 210 may be stacked on the upper surface of the first substrate 100 in the vertical direction Z, and a redistribution pattern may be provided in each layer of the plurality of redistribution insulating layers 210. The upper surface of the redistribution insulating layer located at the top of the stacked plurality of redistribution insulating layers 210 may be understood as the upper surface of the redistribution structure 200, and the lower surface of the redistribution insulating layer located at the bottom of the plurality of stacked redistribution insulating layers 210 may be understood as the lower surface of the redistribution structure 200. The redistribution insulating layer 210 may be formed of, for example, a photo imagable dielectric (PID) or a photosensitive polyimide (PSPI).

The redistribution pattern may be provided in the redistribution insulating layer 210, and may be formed to penetrate the redistribution structure 200 from an upper surface to a lower surface of the redistribution structure 200 to serve as an electrical connection path. The redistribution pattern may include, for example, a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), and the like, or an alloy thereof, but is not limited thereto. In some embodiments, the redistribution pattern may be formed by laminating a metal or an alloy of a metal on a seed layer including copper, titanium, titanium nitride, or titanium tungsten.

The redistribution pattern may include a first redistribution pattern 220, a second redistribution pattern 230, and a third redistribution pattern 240.

The first redistribution pattern 220 may electrically connect the second chip 300 mounted on the upper surface of the redistribution structure 200 with the wiring pattern 122. In some embodiments, the first redistribution pattern 220 may be spaced apart from the second chip 300 in the horizontal directions X and Y, and may electrically connect the third chip 400 mounted on the upper surface of the redistribution structure 200 with the wiring pattern 122. The first redistribution pattern 220 may include a first redistribution line pattern 221 extending in the horizontal direction in the redistribution insulating layer 210, and a first redistribution via pattern 223 electrically connecting the first redistribution line patterns 221 that penetrate the redistribution insulating layer 210 in the vertical direction Z and are respectively provided in the redistribution insulating layers 210 adjacent in the vertical direction. As shown in, for example, FIG. 1, the first redistribution via patterns 223 may have a tapered cross-sectional shape in a horizontal direction from a lower side to the upper side. For example, the plurality of first redistribution via patterns 223 may increase in horizontal width as they extend in an upward direction. That is, for example, in an embodiment, the plurality of first redistribution via patterns 223 may increase in horizontal width as they approach the second chip 300. In other embodiments, the plurality of first redistribution patterns 223 may be tapered in an opposite direction, such that they have a larger width at a bottom portion thereof than at a top portion thereof. In some embodiments, at least some of the plurality of first redistribution line patterns 221 may be formed together with some of the plurality of first redistribution via patterns 223 to form an integral body.

According to example embodiments, the line width of the first redistribution pattern 220 may be smaller than the line width of the wiring pattern 122. The first redistribution pattern 220 may have a finer pattern than the wiring pattern 122. According to embodiments, a width of the first redistribution pattern 220 in a horizontal direction may be smaller than a width of the wiring pattern 122 in the horizontal direction.

The second redistribution pattern 230 may electrically connect the bridge chip 250 with the second chip 300 embedded in the redistribution structure 200, and may electrically connect the bridge chip 250 with the third chip 400. The second redistribution pattern 230 may include a second redistribution line pattern 231 extending in the horizontal direction in the redistribution insulating layer 210, and a second redistribution via pattern 233 electrically connecting the second redistribution line patterns 231 that penetrate the redistribution insulating layer 210 in the vertical direction Z and are respectively provided in the redistribution insulating layers 210 adjacent in the vertical direction. The second redistribution via patterns 233 may have a tapered shape extending horizontally from the lower side to the upper side. For example, the plurality of second redistribution via patterns 233 may increase in horizontal width as they extend in an upward direction. That is, for example, in an embodiment the plurality of second redistribution via patterns 233 may increase in horizontal width as they approach the second chip 300. In other embodiments, the plurality of second redistribution via patterns 233 may be tapered in an opposite direction, such that they have a larger width at a bottom portion thereof than at a top portion thereof. In some example embodiments, at least some of the plurality of second redistribution line patterns 231 may be formed together with some of the plurality of second redistribution via patterns 233 to form an integral body. According to example embodiments, the line width of the second redistribution pattern 230 may be smaller than the line width of the first redistribution pattern 220. The second redistribution pattern 230 may have a finer pattern than the first redistribution pattern 220. According to embodiments, a width of the second redistribution pattern 230 in a horizontal direction may be smaller than a width of the first redistribution pattern 220 in the horizontal direction.

The third redistribution pattern 240 may be electrically connected to the first chip 150 accommodated in the cavity 126 of the first substrate 100. The third redistribution pattern 240 may include a third redistribution line pattern 241 extending in the horizontal direction in the redistribution insulating layer 210, and a third redistribution via pattern 243 electrically connecting the third redistribution line patterns 241 that penetrate the redistribution insulating layer 210 in the vertical direction Z and are respectively provided in the redistribution insulating layers 210 adjacent in the vertical direction. The third redistribution via patterns 243 may have a tapered cross-sectional shape in a horizontal direction from a lower side to an upper side. For example, the plurality of third redistribution via patterns 243 may increase in horizontal width as they approach the bridge chip 250. In other embodiments, the plurality of third redistribution patterns 243 may be tapered in an opposite direction, such that they have a larger width at a bottom portion thereof than at a top portion thereof. In some embodiments, at least some of the plurality of third redistribution line patterns 241 may be formed together with some of the plurality of third redistribution via patterns 243 to form an integral body.

Also, the first redistribution pattern 220 may be electrically connected to the second redistribution pattern 230 or the third redistribution pattern 240 by the redistribution line pattern 261 electrically connecting the first redistribution line pattern 221 to the second redistribution line pattern 231, or the first redistribution line pattern 221 to the third redistribution line pattern 241. As a result, the first to third chips 150, 300, and 400, the bridge chip 250, and the wiring pattern 122 may be electrically connected to each other by the first to third redistribution patterns 220, 230, and 240.

The second chip 300 may be mounted on the upper surface of the redistribution structure 200. The second chip 300 may have an active surface and an inactive surface opposite to the active surface, and may include a second chip pad 320 attached to the active surface. The second chip 300 may be mounted on the upper surface of the redistribution structure 200 through the bump structure 280. The second chip 300 may be electrically connected to the first redistribution pattern 220 by any part of the plurality of bump structures 280 electrically connected to the second chip pad 320, and may be electrically connected to the second redistribution pattern 230 by another part. The bump structure 280 may be formed of, for example, a pillar structure, a ball structure, or a solder layer.

The third chip 400 may be mounted to be spaced apart from the second chip 300 in the horizontal directions X and Y on the upper surface of the redistribution structure 200. In other words, the third chip 400 may be mounted near the second chip 300 on the upper surface of the redistribution structure 200. The third chip 400 may have an active surface and an inactive surface opposite to the active surface, and may include a third chip pad 420 attached to the active surface. The third chip 400 may be mounted on the upper surface of the redistribution structure 200 through the bump structure 280. The third chip 400 may be electrically connected to the first redistribution pattern 220 by any part of the plurality of bump structures 280 electrically connected to the third chip pad 420, and may be electrically connected to the second redistribution pattern 230 by another part.

The underfill layer 290 may be disposed between the first chip 150 and the redistribution structure 200. The underfill layer 290 may be disposed between the first chip 150 and the redistribution structure 200 while surrounding the bump structure 280. The underfill layer 290 may be disposed between the second chip 300 and the redistribution structure 200.

The underfill layer 290 may be formed of, for example, an epoxy resin formed by a capillary under-fill method.

In FIG. 1, the second chip 300 and the third chip 400 are illustrated as being mounted on the upper surface of the redistribution structure 200 in a flip-chip manner, but this is an example, and the method in which the second chip 300 and the third chip 400 are mounted on the upper surface of the redistribution structure 200 is not limited thereto.

The second chip 300 and the third chip 400 may be semiconductor chips. Each of the second chip 300 and the third chip 400 may be a logic chip or a memory chip. For example, the second chip 300 and the third chip 400 may all be the same type of memory chip, or one of the second chip 300 and the third chip 400 may be a memory chip, and the other may be a logic chip. Since the logic chip and the memory chip are the same as or similar to those described above, a detailed description thereof will be omitted.

The second molding member 350 may surround the second chip 300 and the third chip 400 on the upper surface of the redistribution structure 200. The upper surface of the second molding member 350 may be at a higher vertical level than the upper surface of the second chip 300 and the upper surface of the third chip 400. According to example embodiments, the second molding member 350 may include a photosensitive material such as PIE or EMC. Also, the second molding member 350 may include an insulating polymer or an epoxy resin.

The bridge chip 250 may be embedded in the redistribution structure 200. In example embodiments, the bridge chip 250 may be disposed on the stopper metal layer 260. In example embodiments, a lower surface of the bridge chip 250 may directly contact the stopper metal layer 260. The bridge chip 250 may be electrically connected to the second redistribution pattern 230. The bridge chip 250 may electrically connect the second chip 300 with the third chip 400. According to embodiments, when the second chip pad 320 of the second chip 300 and the third chip pad 420 of the third chip 400 have different pitches, the bridge chip 250 may electrically connect the second chip 300 to the third chip 400 through a bridge circuit having a pitch corresponding to the pitch of each of the second chip pad 320 and the third chip pad 420 inside the bridge chip 250. That is, the bridge chip 250 may serve as a bridge electrically connecting a plurality of semiconductor chips mounted on the upper surface of the redistribution structure 200. According to embodiments, the bridge chip 250 may include a silicon substrate, but it is not limited thereto.

According to example embodiments, the first chip 150 may be a bridge chip. When the first chip 150 is a bridge chip, the semiconductor package 10 may include two bridge chips including the bridge chip 250 embedded in the redistribution structure 200. In such an embodiment, the thickness of the bridge chip 250 may be reduced through the first chip 150, which is the bridge chip.

When the first chip 150 is a memory chip or a logic chip, the line width of the third redistribution pattern 240 may be greater than the line width of the second redistribution pattern 230. That is, the line width of the second redistribution pattern 230 may be smaller than the line width of the third redistribution pattern 240. The second redistribution pattern 230 may have a finer pattern than the third redistribution pattern 240. According to embodiments, a width of the second redistribution pattern 230 in a horizontal direction may be smaller than a width of the third redistribution pattern 240 in a horizontal direction.

On the other hand, when the first chip 150 is a bridge chip, the line width of the third redistribution pattern 240 may be smaller than the line width of the first redistribution pattern 220. That is, the third redistribution pattern 240 may have a finer pattern than the first redistribution pattern 220. According to embodiments, a width of the third redistribution pattern 240 in a may be smaller than a width of the first redistribution pattern 220 in a horizontal direction.

The stopper metal layer 260 may be located in the redistribution structure 200. The stopper metal layer 260 may be disposed between the bridge chip 250 and the first chip 150. The first chip 150 and the bridge chip 250 may be spaced apart from each other in the vertical direction Z with the stopper metal layer 260 therebetween. The stopper metal layer 260 may be configured to have resistance to the laser beam. According to example embodiments, the stopper metal layer 260 may include copper. The stopper metal layer 260 may be formed through a plating method. For example, electroplating, electroless plating, or immersion plating methods may be used.

The stopper metal layer 260 may have a rectangular flat plate shape on the X-Y plane, but is not limited thereto. According to example embodiments, the footprint of the stopper metal layer 260 may be larger than that of the bridge chip 250. For example, when viewed in cross-section, a length in a horizontal direction of the stopper metal layer 260 may be greater than a length in a horizontal direction of the bridge chip 250.

The external connection bump 160 may electrically and physically connect the semiconductor package 10 with an external device on which the semiconductor package 10 is mounted. The external connection bump 160 may be attached to the wiring pad 122c disposed on the lower surface of the first substrate 100. The external connection bump 160 may be electrically connected to the wiring pad 122c. The external connection bump 160 may be electrically connected to the wiring patterns 122 in the first substrate 100 through the wiring pad 122c. The external connection bump 160 may be electrically connected to an external device, for example, a motherboard. Accordingly, the first chip 150, the second chip 300, or the third chip 400 may be electrically connected to an external device through the redistribution pattern, the wiring pattern 122, the wiring pad 122c, and the external connection bump 160. The external connection bump 160 may be, for example, a solder ball or a solder bump.

In relation to the semiconductor package 10 according to embodiments, since the first chip 150 is mounted in the cavity of the first substrate 100, the bridge chip 250 is mounted in the redistribution structure 200, and the second chip 300 and the third chip 400 are mounted on the upper surface of the redistribution structure 200, it is possible to increase the degree of integration of the semiconductor package. In addition, since the first chip 150 is not limited to a memory chip or a logic chip, and may include a bridge chip, the layer of the bridge chip 250 buried in the redistribution structure 200 may be reduced, and thus the thickness of the semiconductor package 10 may be reduced.

Figure 2:
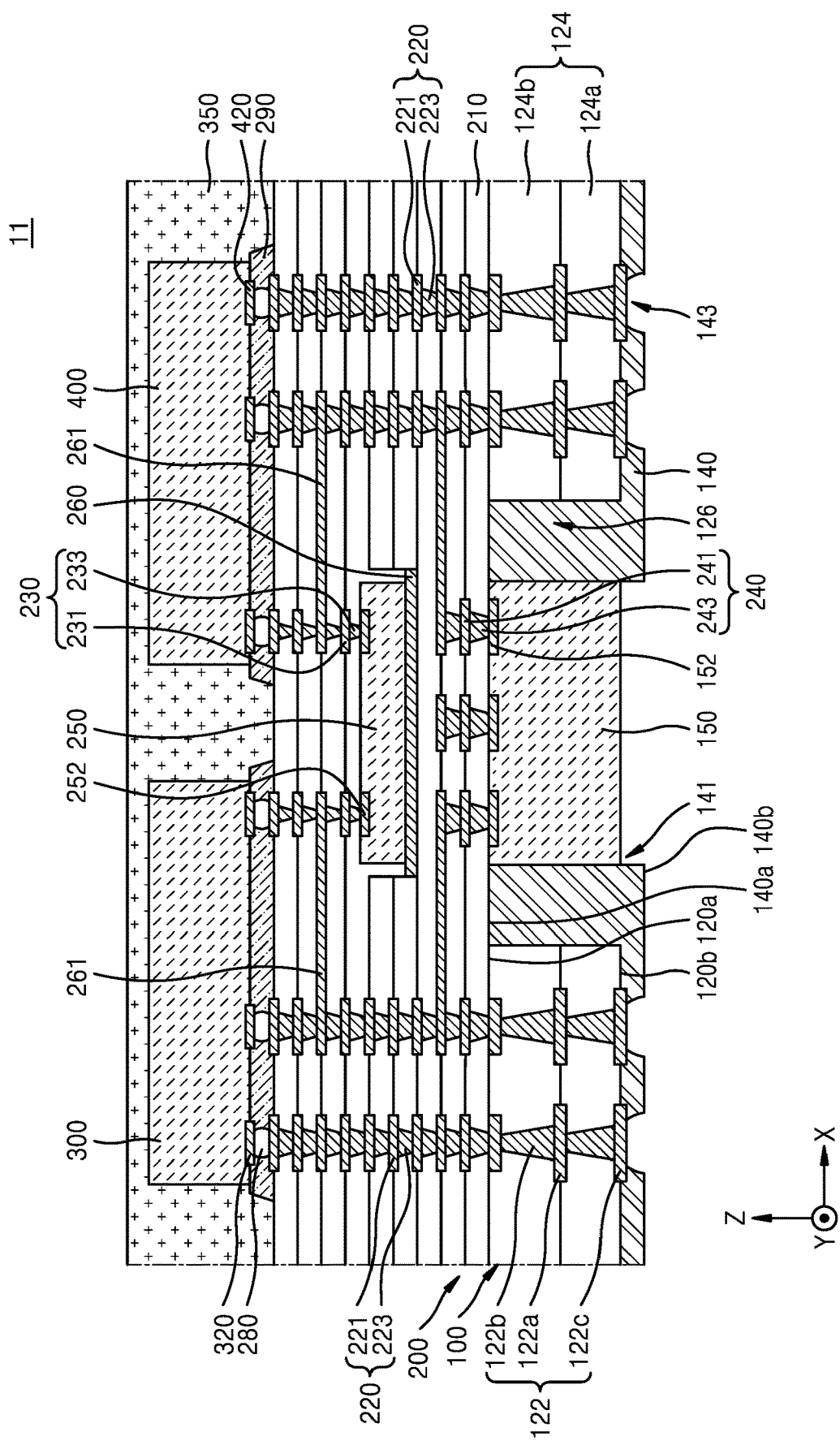
FIG. 2 is a cross-sectional view illustrating a semiconductor package according to an example embodiment.

FIG. 2 is a cross-sectional view illustrating a semiconductor package according to an embodiment. Hereinafter, overlapping contents of the semiconductor package 10 of FIG. 1 and the semiconductor package 11 of FIG. 2 will be omitted, and differences will be mainly described.

Referring to FIG. 2, the semiconductor package 11 may include a first substrate 100, a redistribution structure 200, a first molding member 140, and a second molding member 350. Also, the semiconductor package 11 may include a first chip 150, a second chip 300, a third chip 400, and a bridge chip 250 mounted in the semiconductor package 11.

The first molding member 140 may fill the cavity 126 of the first substrate 100 and surround the first chip 150. In some embodiments, the first molding member 140 may fill the cavity 126 and surround only the sidewall of the first chip 150 so that the lower surface of the first chip 150 is exposed. In some embodiments, the first molding member 140 may fill the cavity 126, cover the first chip 150, and cover the second surface 120*b* of the first substrate 100. At this time, according to embodiments, a first opening 141 exposing a lower surface of the first chip 150 and a second opening 143 exposing a lower surface of the wiring pad 122*c* may be formed on a lower surface of the first molding member 140. At least a portion of a lower surface of the first chip 150 may be exposed by the first opening 141. In example embodiments, the entire lower surface of the first chip 150 may be exposed by the first opening 141.

The wiring pad 122*c* may be electrically connected to the external connection bump 160 (refer to FIG. 1) through the second opening 143 of the first molding member 140. The external connection bump 160 (refer to FIG. 1) may be attached to the wiring pad 122*c* through the second opening 143. The second opening 143 may have a tapered shape in which the horizontal width becomes narrower as the level in the vertical direction Z increases.

Figure 3:
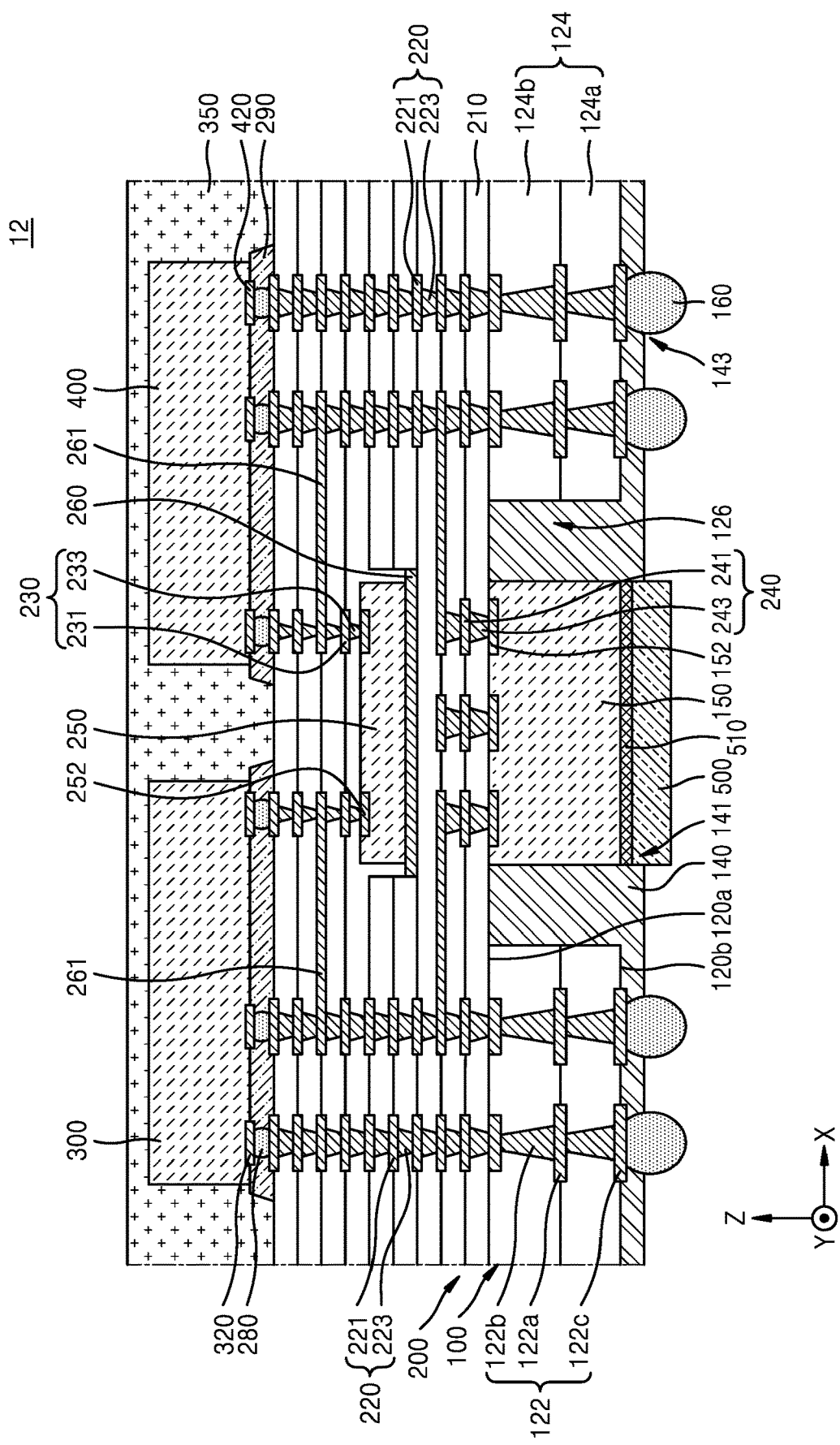
FIG. 3 is a cross-sectional view illustrating a semiconductor package according to an example embodiment.

FIG. 3 is a cross-sectional view illustrating a semiconductor package according to an embodiment. Hereinafter, overlapping contents of the semiconductor package 11 of FIG. 2 and the semiconductor package 12 of FIG. 3 will be omitted, and differences will be mainly described.

Referring to FIG. 3, the semiconductor package 12 may further include a first heat dissipation member 500 and a first thermal interface material (TIM) layer 510.

The first heat dissipation member 500 may be attached to the lower surface of the first chip 150. The first heat dissipation member 500 may be attached to the lower surface of the first chip 150 through the first opening 141 of the first molding member 140. According to embodiments, the first heat dissipation member 500 may be configured to discharge heat transferred from the first chip 150 to the outside. The first heat dissipation member 500 may be, for example, a heat sink, a heat spreader, a heat pipe, or a liquid cooled cold plate. A thickness along the vertical direction Z of the first heat dissipation member 500 may be in a range of about 2 mm to about 4 mm.

The first TIM layer 510 may be configured to attach the first chip 150 and the first heat dissipation member 500 to each other. The first TIM layer 510 may be disposed between the first chip 150 and the first heat dissipation member 500. The first TIM layer 510 may be made of an insulating material or a material capable of maintaining electrical insulation and including an insulating material. The first TIM layer 510 may include, for example, an insulating base layer such as an epoxy resin, and a heat dissipation filler included in the insulating base layer. The first TIM layer 510 may be, for example, mineral oil, grease, gap filler putty, phase change gel, phase change material pads. or a particle filled epoxy. According to example embodiments, the first TIM layer 510 may have a thermal conductivity of about 3 W/mK to about 4 W/mK.

The semiconductor package 12 according to an embodiment may easily dissipate heat generated inside the semiconductor package 12 to the outside by the first heat dissipation member 500 attached to the upper surface of the second chip 300 and the third chip 400.

Figure 4:
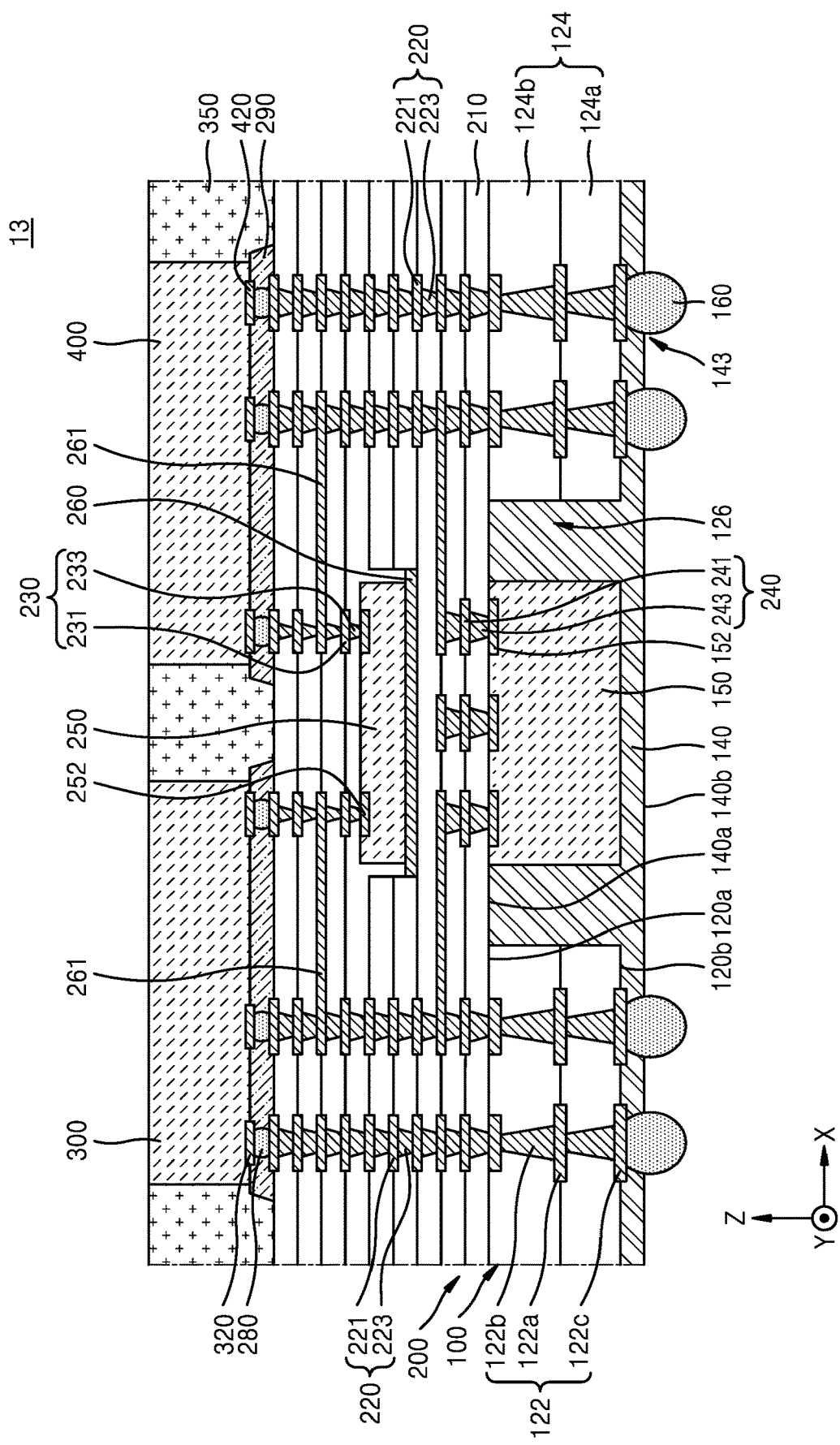
FIG. 4 is a cross-sectional view illustrating a semiconductor package according to an example embodiment.

FIG. 4 is a cross-sectional view illustrating a semiconductor package according to an embodiment. Hereinafter, overlapping contents of the semiconductor package 10 of FIG. 1 and the semiconductor package 13 of FIG. 4 will be omitted, and differences will be mainly described.

Referring to FIG. 4, the semiconductor package 13 may include a first substrate 100, a redistribution structure 200, a first molding member 140, and a second molding member 350. Also, the semiconductor package 13 may include a first chip 150, a second chip 300, a third chip 400, and a bridge chip 250 mounted in the semiconductor package 13.

In the semiconductor package 13, the upper surface of the second molding member 350 may be on the same plane as the upper surface of the second chip 300 and the upper surface of the third chip 400. The level along the vertical direction Z of the upper surface of the second molding member 350 may be the same as the level along the vertical direction Z of the upper surface of the second chip 300 and the upper surface of the third chip 400.

The second molding member 350 may have the same vertical direction Z level as the upper surface of the second chip 300 and the upper surface of the third chip 400 through a planarization process. The upper surface of the second chip 300 and the upper surface of the third chip 400 may be exposed through the planarization process. That is, the sidewall of the second chip 300 and the sidewall of the third chip 400 are surrounded by the second molding member 350, and the upper surface of the second chip 300 and the upper surface of the third chip 400 are may be exposed.

Figure 5:
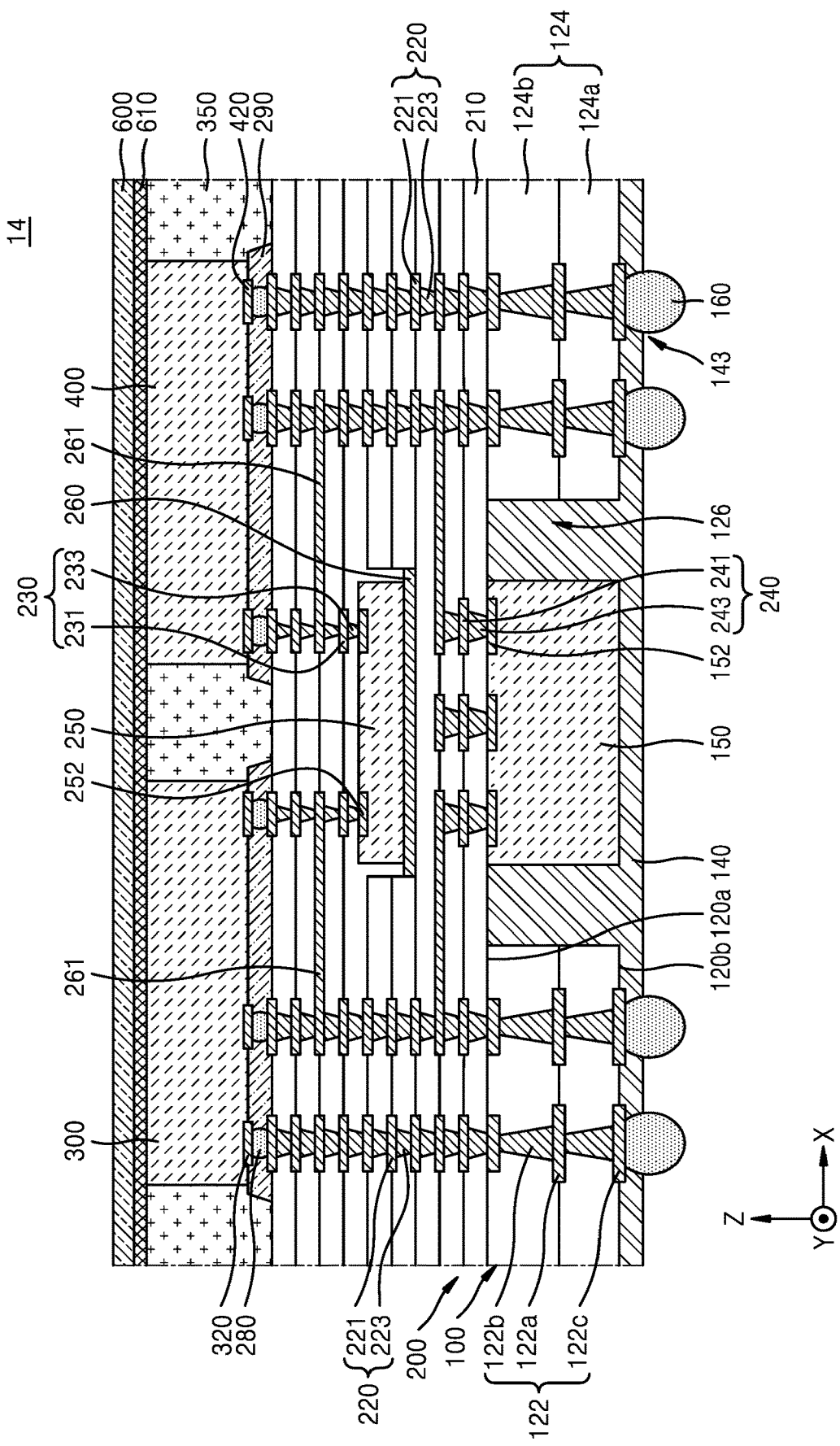
FIG. 5 is a cross-sectional view illustrating a semiconductor package according to an example embodiment.

FIG. 5 is a cross-sectional view illustrating a semiconductor package according to an embodiment. Hereinafter, overlapping contents of the semiconductor package 13 of FIG. 4 and the semiconductor package 14 of FIG. 5 will be omitted, and differences will be mainly described.

Referring to FIG. 5, the semiconductor package 14 may further include a second heat dissipation member 600 and a second TIM layer 610.

The second heat dissipation member 600 may be attached to the upper surface of the second chip 300 and the upper surface of the third chip 400. In some embodiments, the second heat dissipation member 600 may be attached to the upper surface of the second molding member 350, the upper surface of the second chip, and the upper surface of the third chip 400. The second heat dissipation member 600 may be configured to dissipate heat from the second chip 300 and the third chip 400 to the outside. The second heat dissipation member 600 may be, for example, a heat sink, a heat spreader, a heat pipe, or a liquid cooled cold plate. A thickness in the vertical direction of the second heat dissipation member 600 may be in a range of from about 2 mm to about 4 mm.

The second TIM layer 610 may be configured to attach the second chip 300 and the third chip 400 to the second heat dissipation member 600. The second TIM layer 610 may be disposed between the second chip 300 and the third chip 400 and the second heat dissipation member 600. According to embodiments, the second TIM layer 610 may be configured to attach the second heat dissipation member 600 to the upper surface of the second molding member 350, the upper surface of the second chip 300, and the upper surface of the third chip 400. The second TIM layer 610 may be disposed between the upper surfaces of the second chip 300, the third chip 400, and the second molding member 350 and the second heat dissipation member 600.

The semiconductor package 14 according to an embodiment may easily dissipate heat generated inside the semiconductor package 14 to the outside by the second heat dissipation member 600 attached to the lower surface of the first chip 150.

Figure 6:
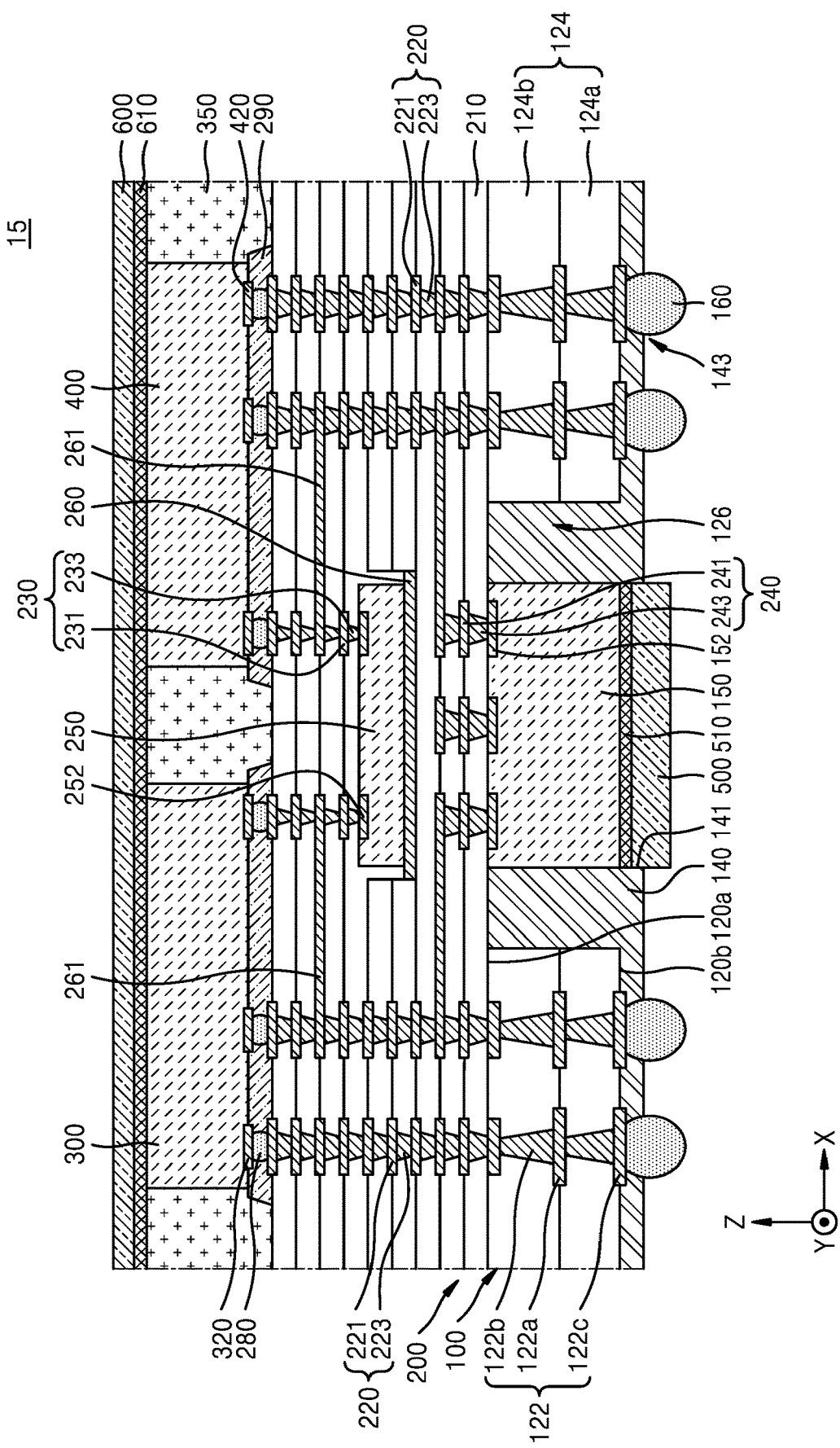
FIG. 6 is a cross-sectional view illustrating a semiconductor package according to an example embodiment.

FIG. 6 is a cross-sectional view illustrating a semiconductor package according to an embodiment. Hereinafter, overlapping contents of the semiconductor package 10 of FIG. 1 and the semiconductor package 15 of FIG. 6 will be omitted, and differences will be mainly described.

Referring to FIG. 6, the semiconductor package 15 may include a first substrate 100, a redistribution structure 200, a first molding member 140, and a second molding member 350, and a first chip 150, a second chip 300, a third chip 400, and a bridge chip 250 mounted in the semiconductor package 15 may be included. In addition, the semiconductor package 15 may further include a first heat dissipation member 500, a first TIM layer 510, a second heat dissipation member 600, and a second TIM layer 610.

The first molding member 140 may fill the cavity 126 of the first substrate 100 and surround the first chip 150. In some embodiments, the first molding member 140 may fill the cavity 126 and surround only the sidewall of the first chip 150 so that the lower surface of the first chip 150 is exposed. A first opening 141 for exposing a lower surface of the first chip 150 and a second opening 143 for exposing a lower surface of the wiring pad 122c may be formed on a lower surface of the first molding member 140. At least a portion of the lower surface of the first chip 150 may be exposed through the first molding member 140 by the first opening 141. In example embodiments, the entire lower surface of the first chip 150 may be exposed through the first molding member 140 by the first opening 141.

The wiring pad 122c may be electrically connected to the external connection bump 160 (refer to FIG. 1) through the second opening 143 of the first molding member 140. The external connection bump 160 (refer to FIG. 1) may be attached to the wiring pad 122c through the second opening 143. The second opening 143 may have a tapered shape in which the horizontal width becomes narrower as the level in the vertical direction Z increases.

The first heat dissipation member 500 may be attached to the lower surface of the first chip 150. The first heat dissipation member 500 may be attached to the lower surface of the first chip 150 through the first opening 141 of the first molding member 140. The first heat dissipation member 500 may be configured to dissipate heat from the first chip 150 to the outside. The first heat dissipation member 500 may be, for example, a heat sink, a heat spreader, a heat pipe, or a liquid cooled cold plate. A thickness along the vertical direction Z of the first heat dissipation member 500 may be in a range of about 2 mm to about 4 mm.

The first TIM layer 510 may be configured to attach the first chip 150 and the first heat dissipation member 500 to each other. The first TIM layer 510 may be disposed between the first chip 150 and the first heat dissipation member 500.

In the semiconductor package 15, the upper surface of the second molding member 350 may be on the same plane as the upper surface of the second chip 300 and the upper surface of the third chip 400. The level along the vertical direction Z of the upper surface of the second molding member 350 may be the same as the level along the vertical direction Z of the upper surface of the second chip 300 and the upper surface of the third chip 400.

The second molding member 350 may have the same vertical direction Z level as the upper surface of the second chip 300 and the upper surface of the third chip 400 through a planarization process. The upper surface of the second chip 300 and the upper surface of the third chip 400 may be exposed through the planarization process. That is, the sidewall of the second chip 300 and the sidewall of the third chip 400 are surrounded by the second molding member 350, and the upper surface of the second chip 300 and the upper surface of the third chip 400 are may be exposed.

The second heat dissipation member 600 may be attached to the upper surface of the second chip 300 and the upper surface of the third chip 400. The second heat dissipation member 600 may be attached to the upper surface of the second chip 300 and the upper surface of the third chip 400 through the exposed portion. In some embodiments, the second heat dissipation member 600 may be attached to the upper surface of the second molding member 350, the upper surface of the second chip, and the upper surface of the third chip 400. The second heat dissipation member 600 may be configured to dissipate heat from the second chip 300 and the third chip 400 to the outside. A thickness in the vertical direction of the second heat dissipation member 600 may be in a range of about 2 mm to about 4 mm.

The second TIM layer 610 may be configured to attach the second chip 300 and the third chip 400 to the second heat dissipation member 600. The second TIM layer 610 may be disposed between the second chip 300 and the third chip 400 and the second heat dissipation member 600. According to embodiments, the second TIM layer 610 may be configured to attach the second heat dissipation member 600 to the upper surface of the second molding member 350, the upper surface of the second chip 300, and the upper surface of the third chip 400. The second TIM layer 610 may be disposed between the upper surfaces of the second chip 300, the third chip 400, and the second molding member 350 and the second heat dissipation member 600.

As a result, the semiconductor package 15 may easily dissipate heat generated inside the semiconductor package 15 to the outside by the first heat dissipation member 500 provided at the lower end of the semiconductor package 15 and the second heat dissipation member 600 provided at the upper end of the semiconductor package 15.

Figure 7:
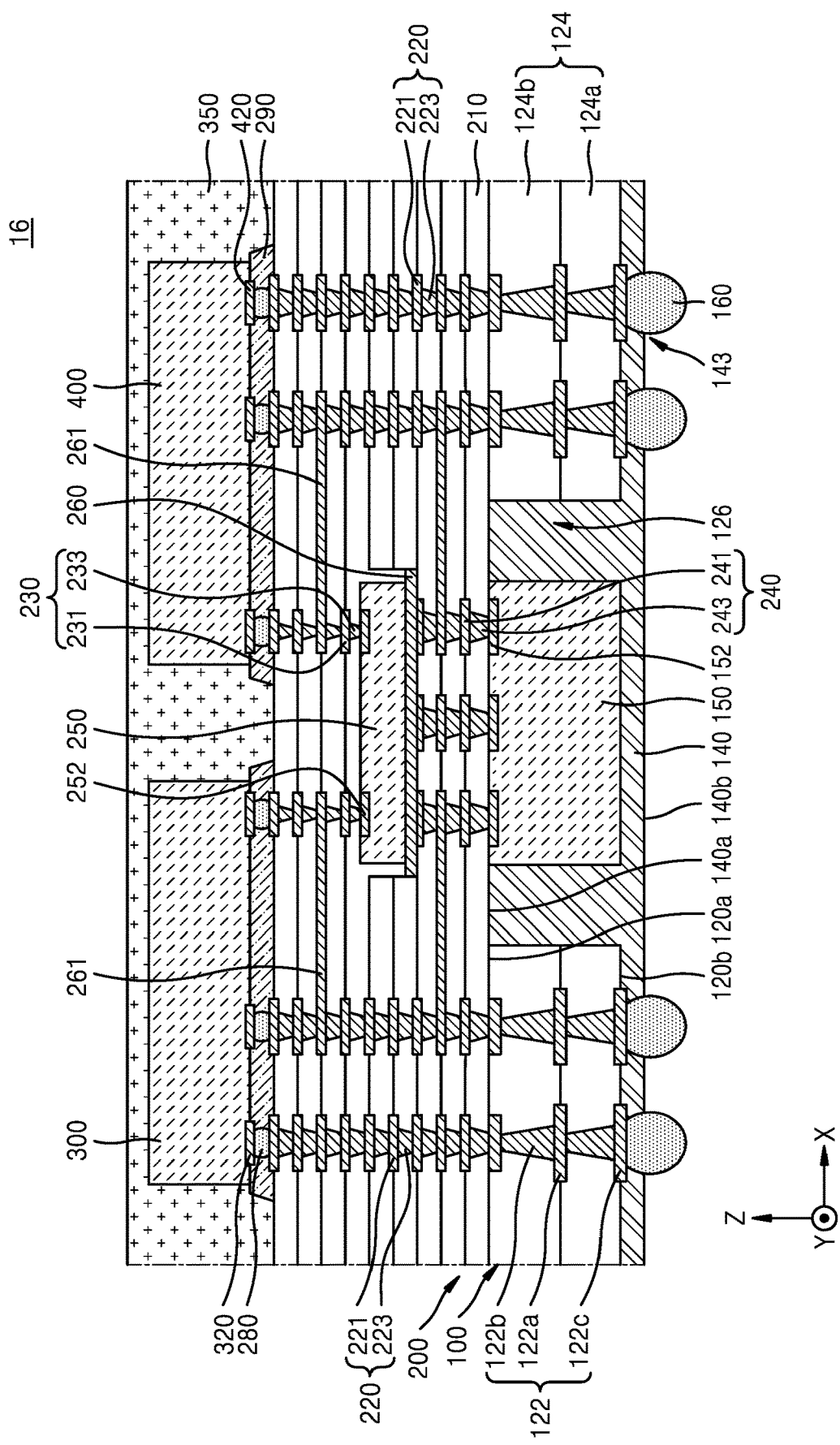
FIG. 7 is a cross-sectional view illustrating a semiconductor package according to an example embodiment.

FIG. 7 is a cross-sectional view illustrating a semiconductor package according to an embodiment. Hereinafter, overlapping contents of the semiconductor package 10 of FIG. 1 and the semiconductor package 16 of FIG. 7 will be omitted, and differences will be mainly described.

Referring to FIG. 7, the semiconductor package 16 may include a first substrate 100, a redistribution structure 200, a first molding member 140, and a second molding member 350. Also, the semiconductor package 16 may include a first chip 150, a second chip 300, a third chip 400, and a bridge chip 250 mounted in the semiconductor package 16. The redistribution structure 200 may include a redistribution pattern, and the redistribution pattern may include first to third redistribution patterns 220, 230, and 240.

The third redistribution pattern 240 may electrically connect between the first chip 150 and the stopper metal layer 260. Accordingly, the third redistribution pattern 240 is formed to penetrate from the lower surface of the stopper metal layer 260 to the upper surface of the first chip 150 and to serve as an electrical connection path between the bridge chip 250 and the first chip 150.

The stopper metal layer 260 may be electrically connected to the third redistribution pattern 240. In this case, the stopper metal layer 260 may include a grounded ground connection layer, and may be electrically connected to the third redistribution pattern 240 through the grounded ground connection layer.

Figure 8A:
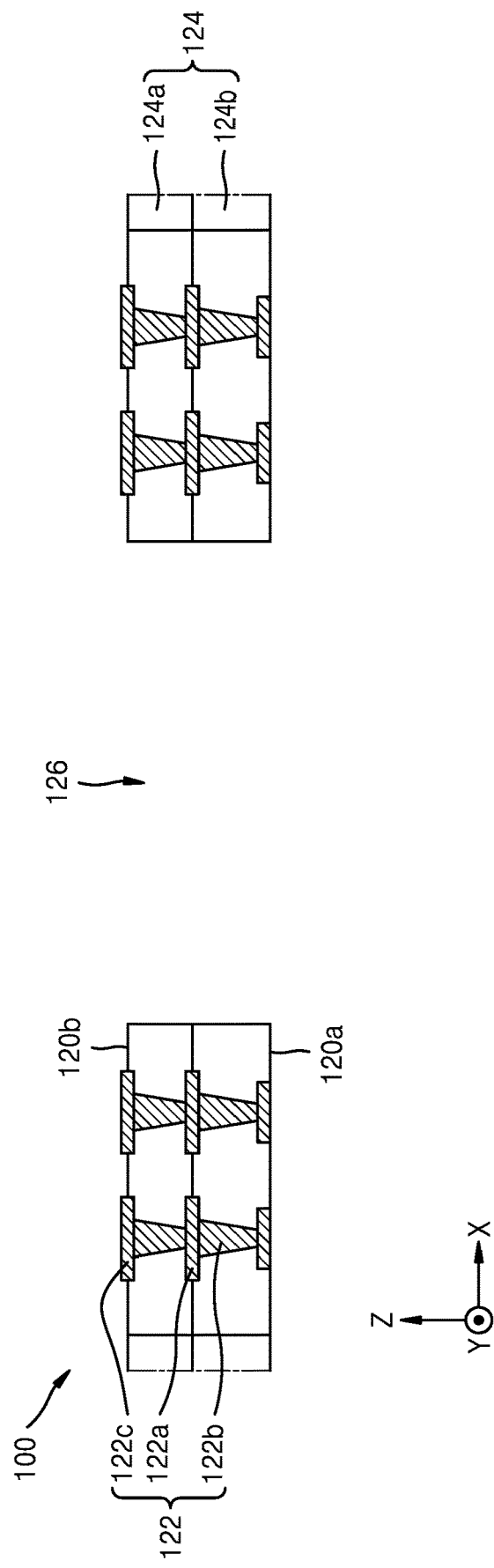
FIGS. 8A to 8R are diagrams for explaining a method of manufacturing a semiconductor package according to an example embodiment.
Figure 8B:
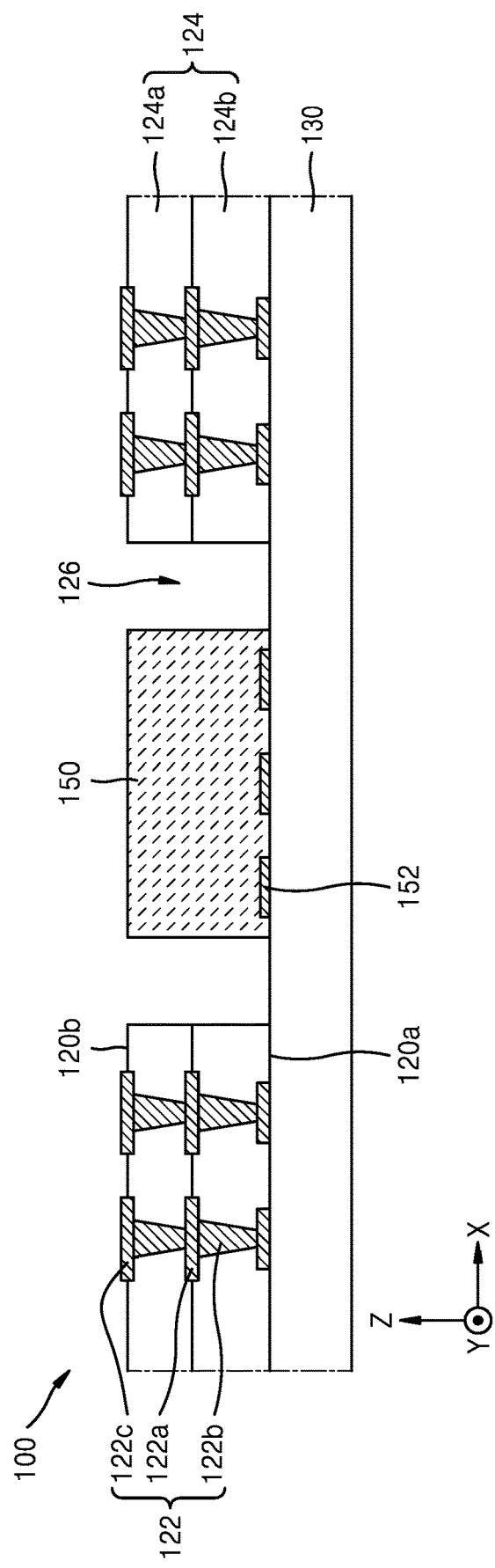
Figure 8C:
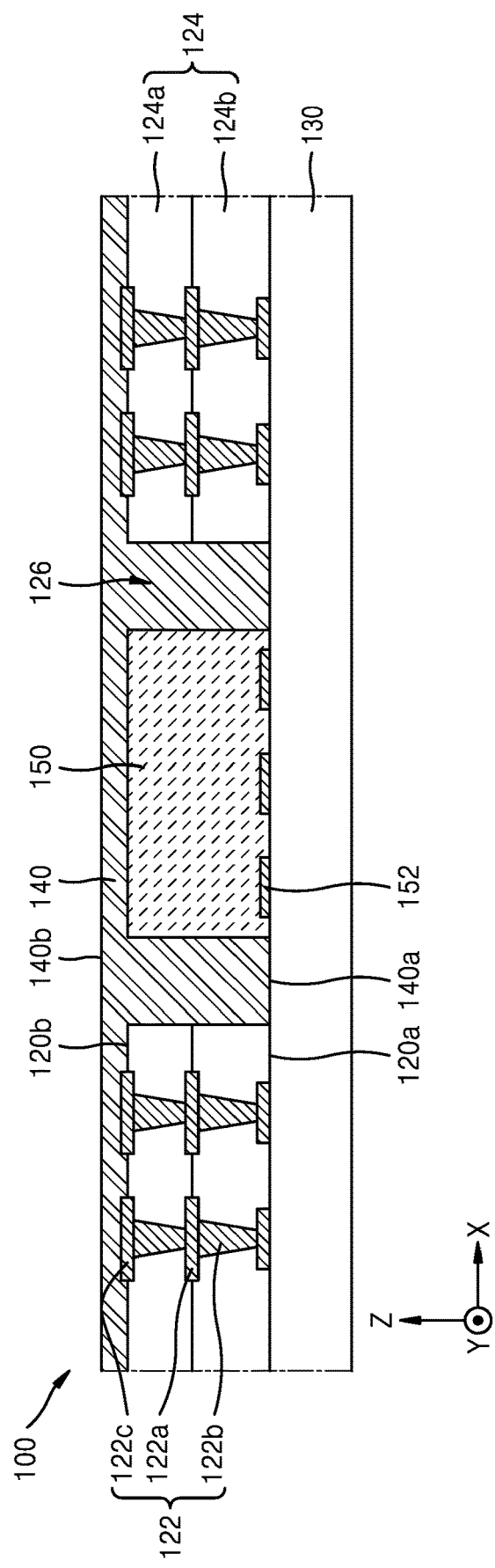
Figure 8D:
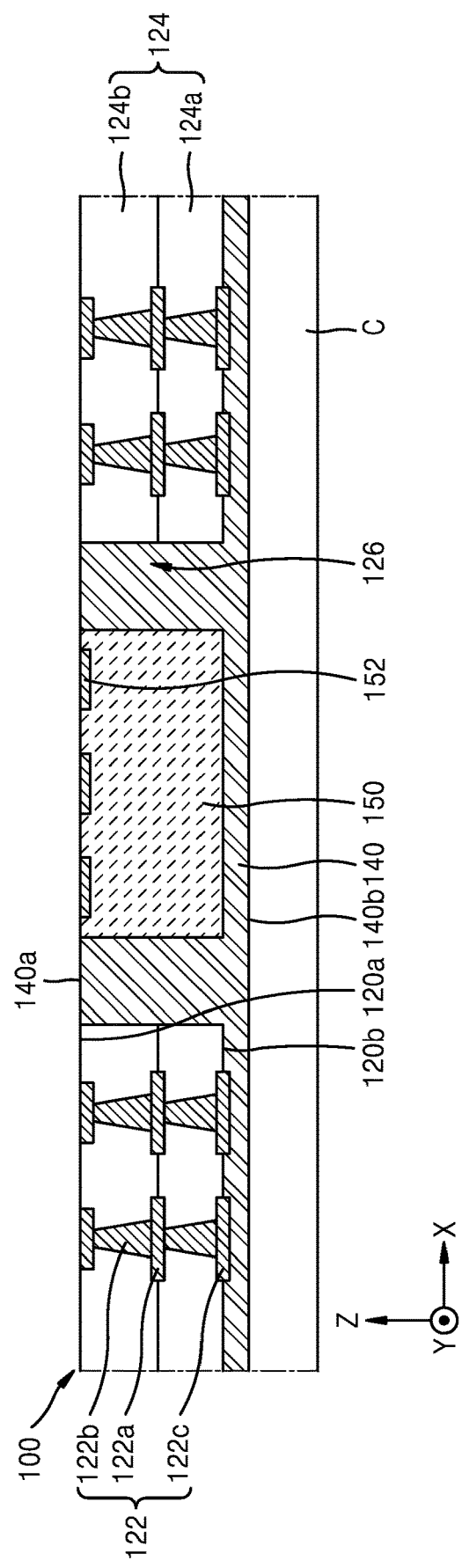
Figure 8E:
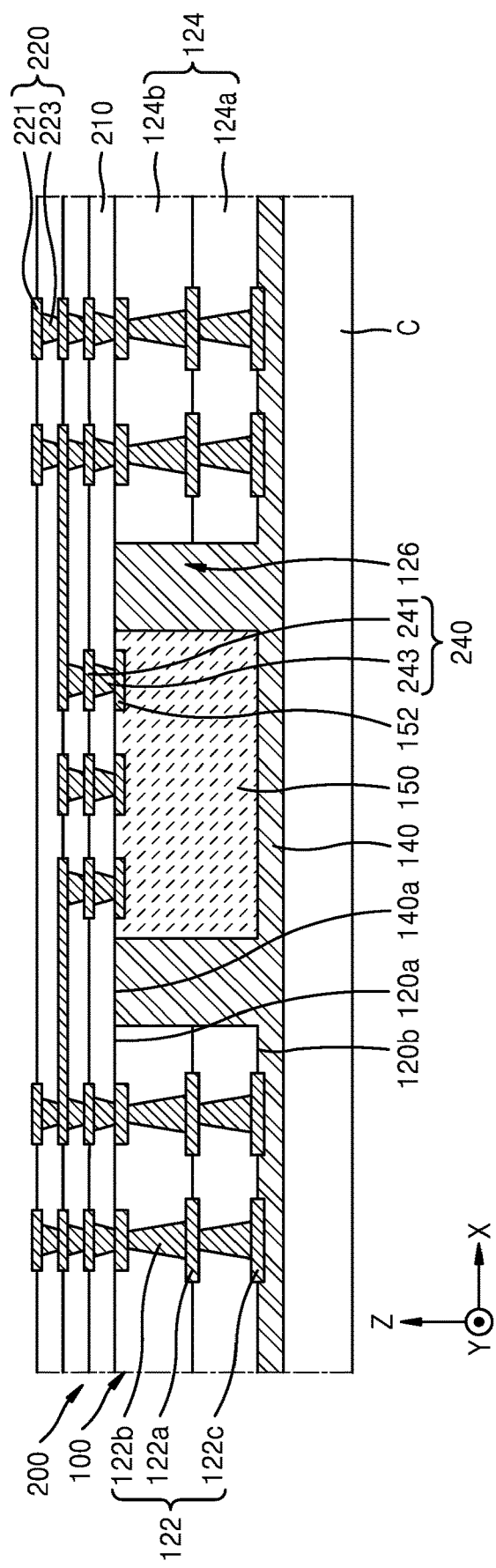
Figure 8F:
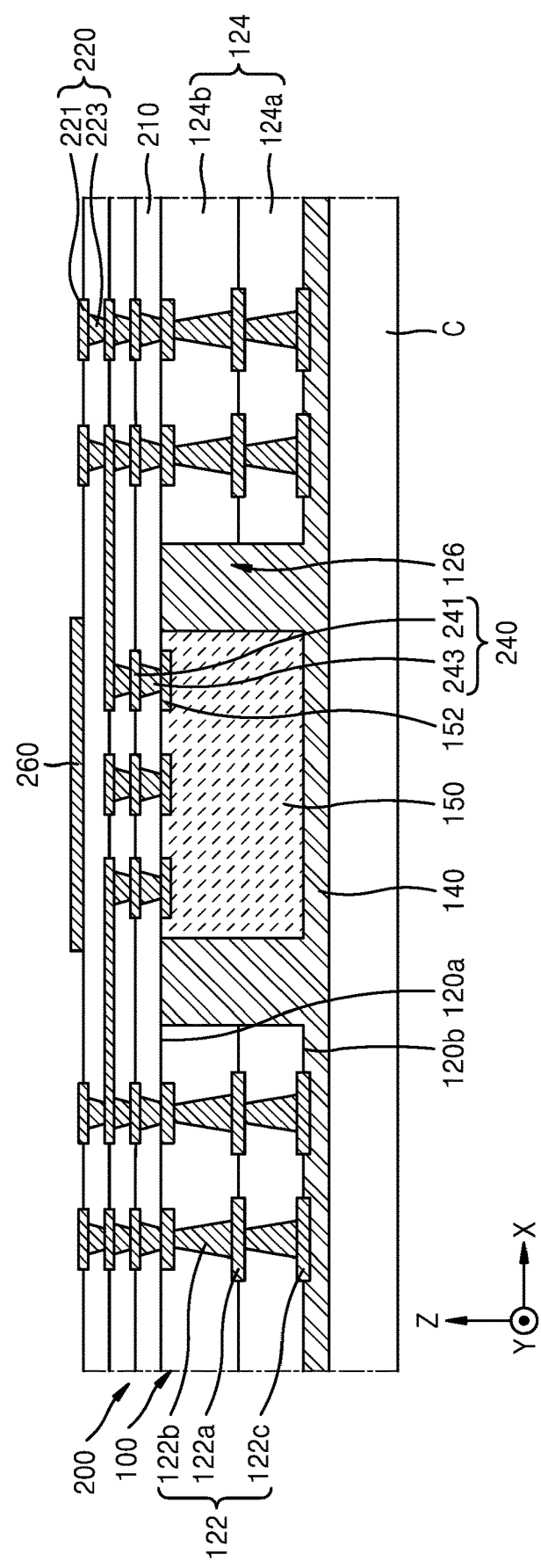
Figure 8G:
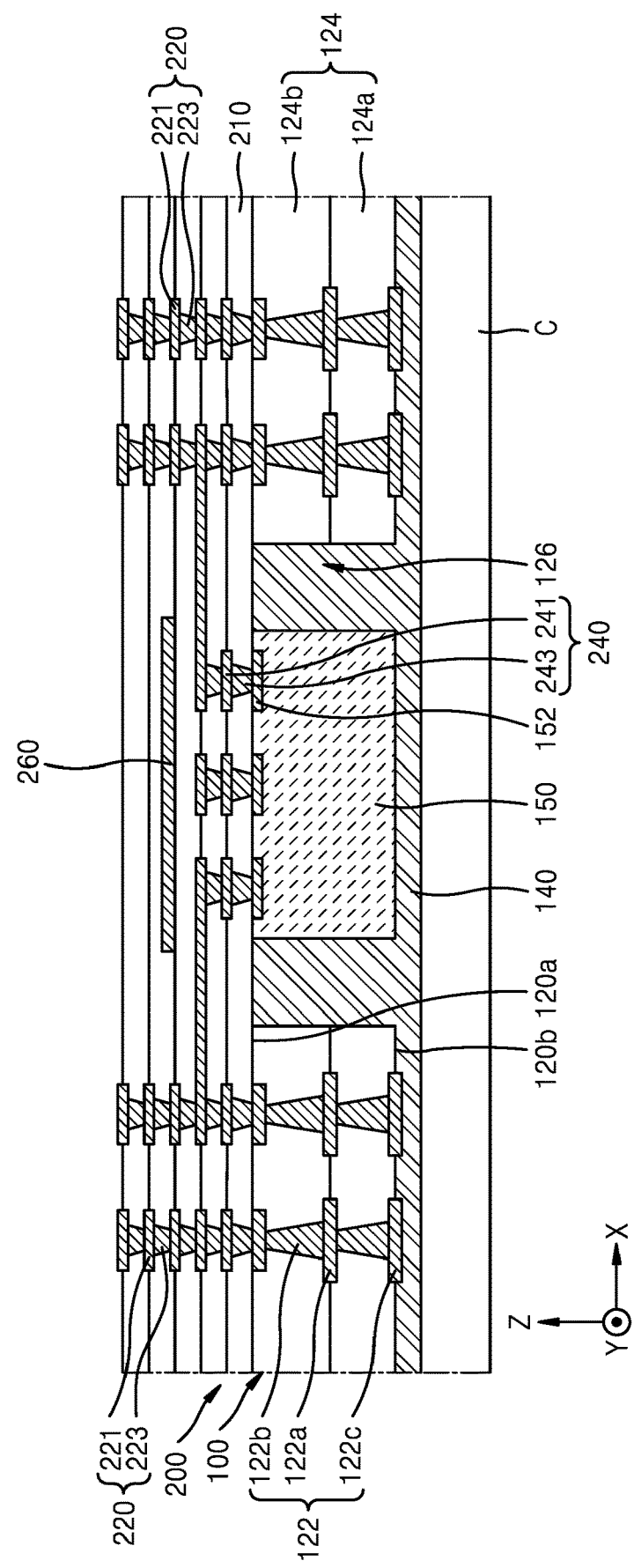
Figure 8H:
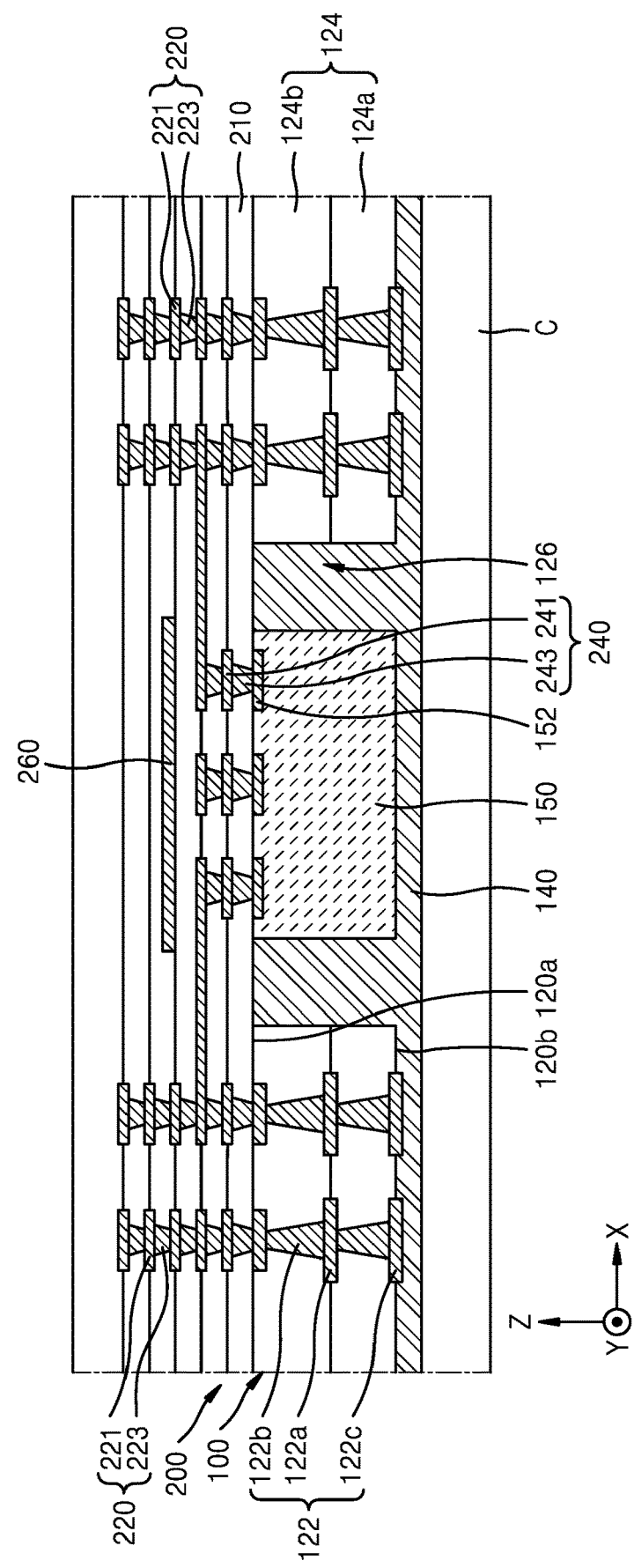
Figure 8I:
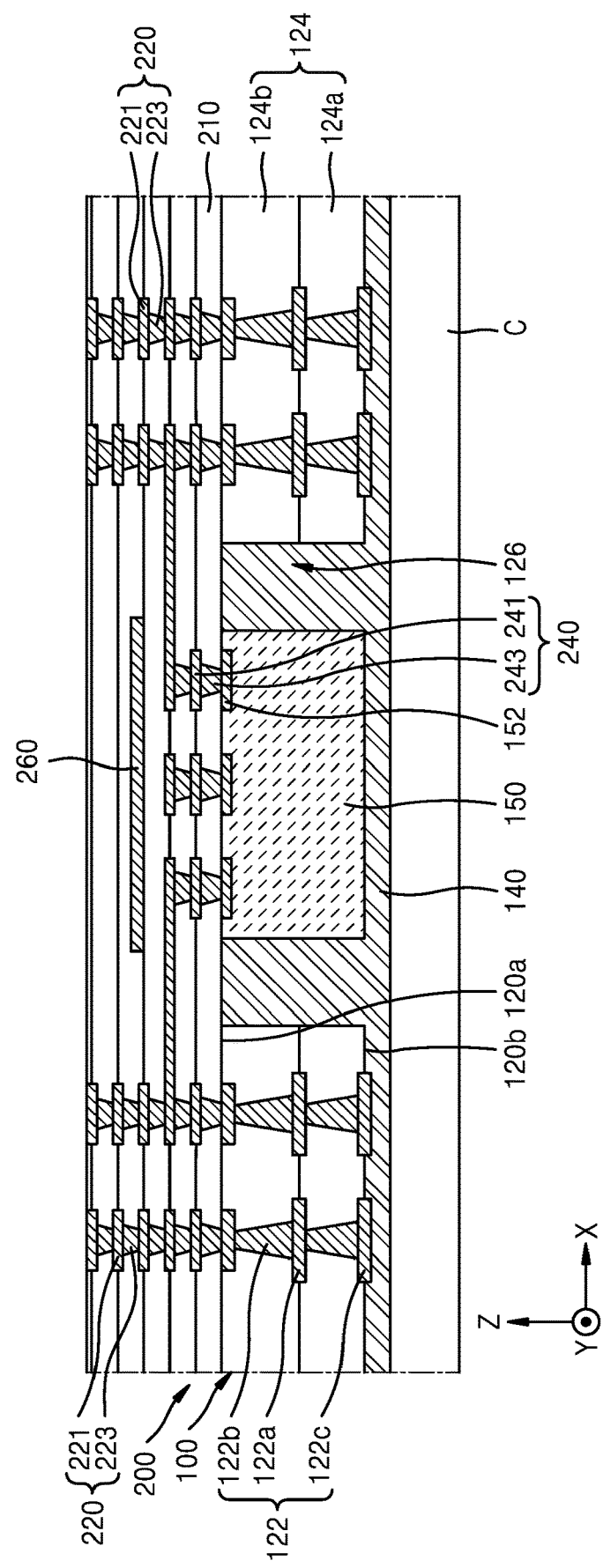
Figure 8J:
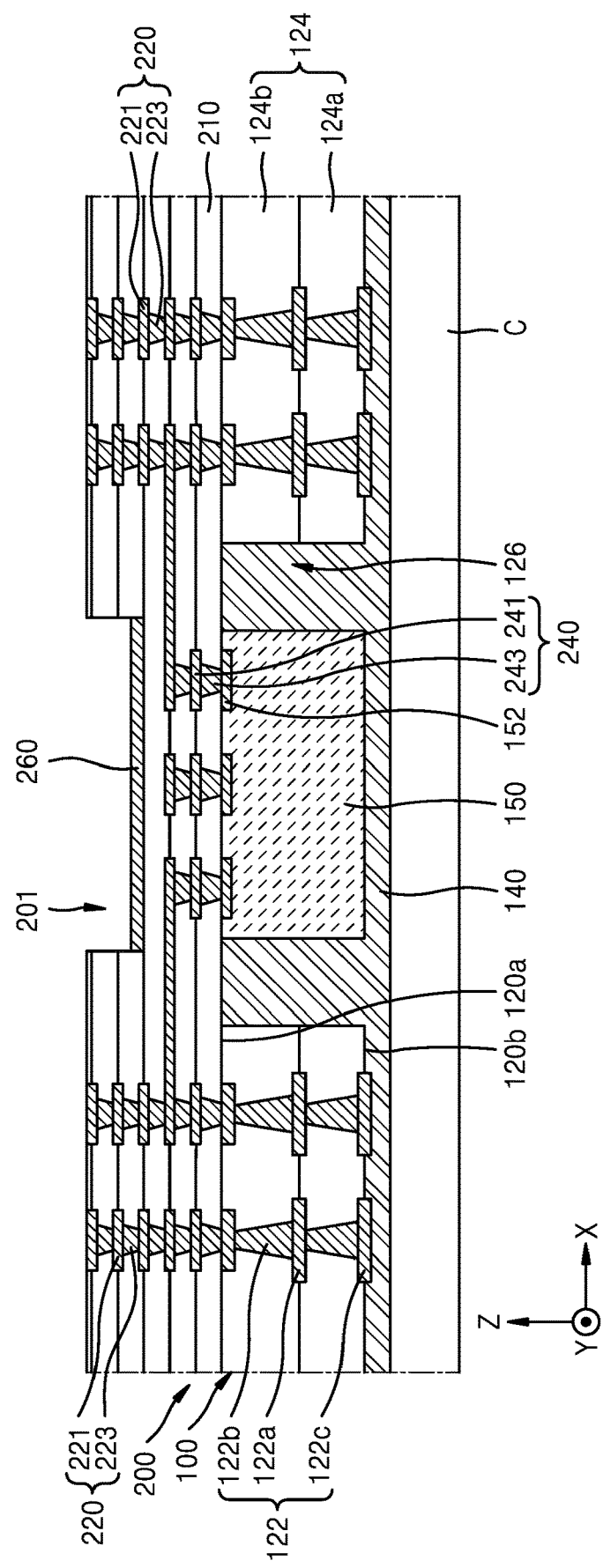
Figure 8K:
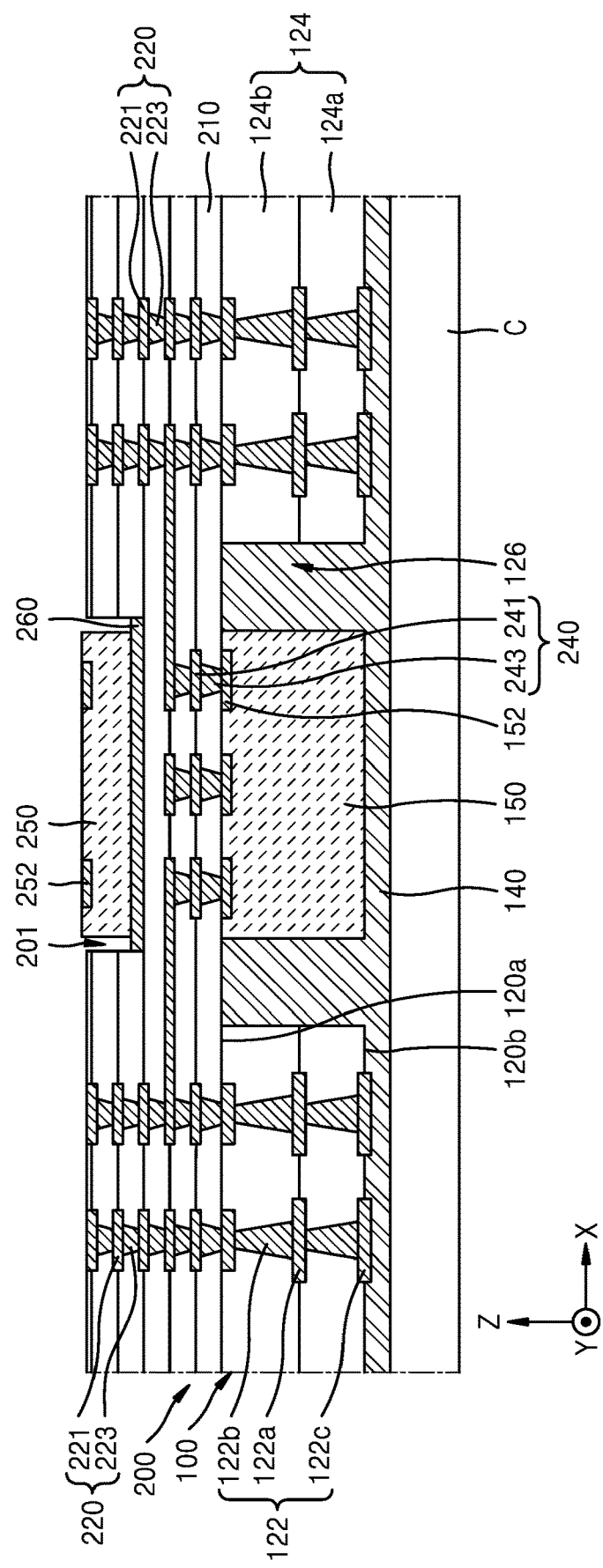
Figure 8L:
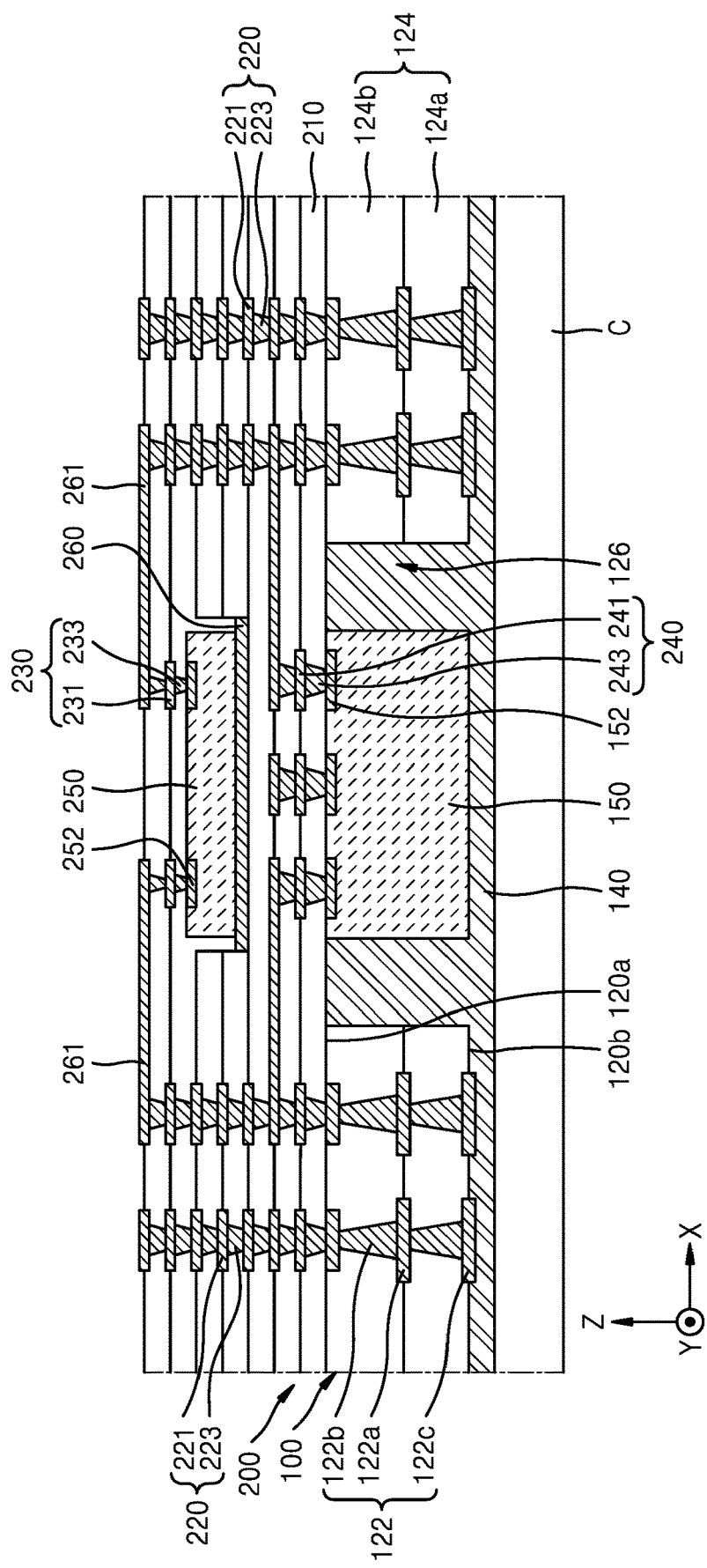
Figure 8M:
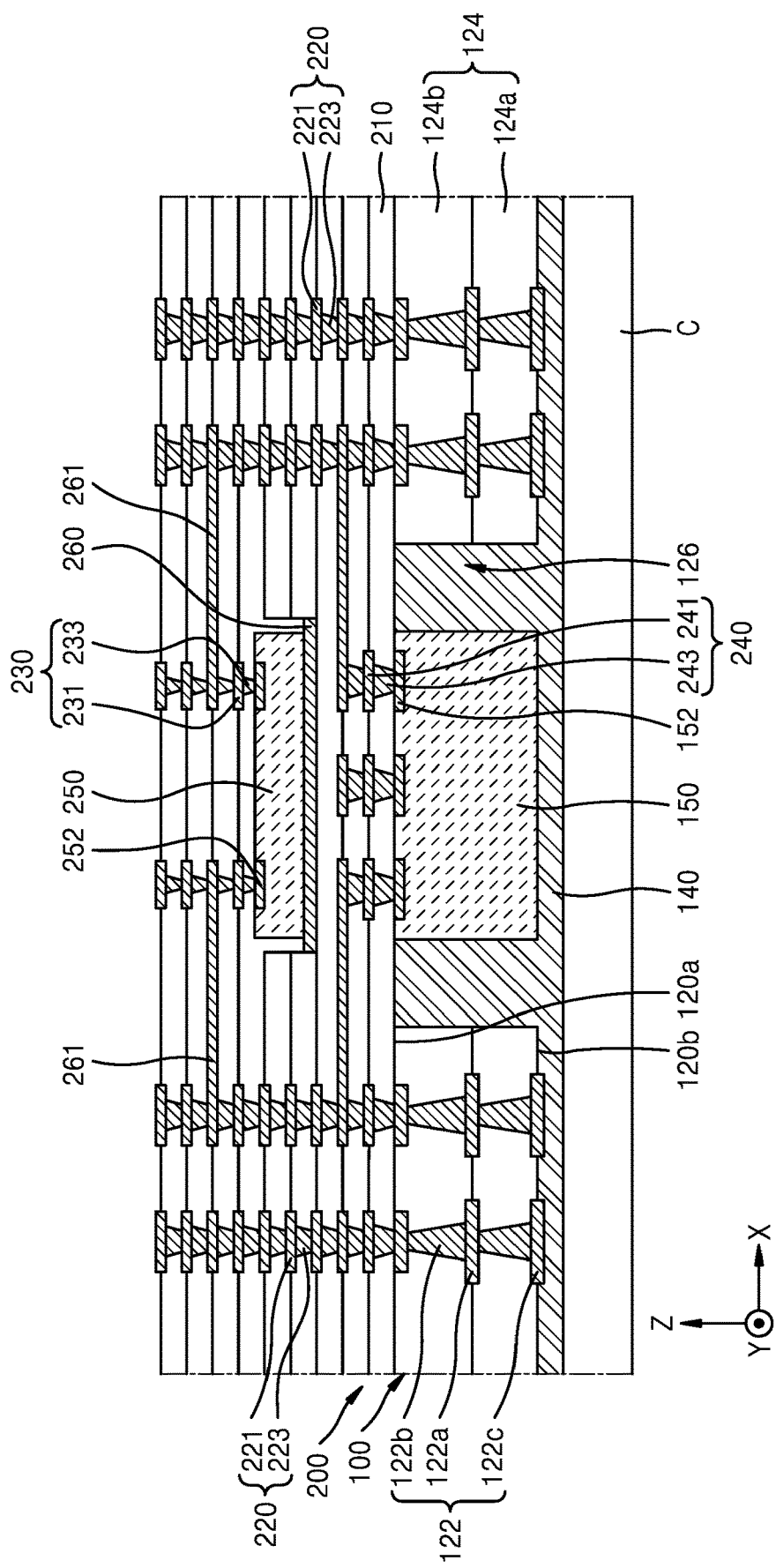
Figure 8N:
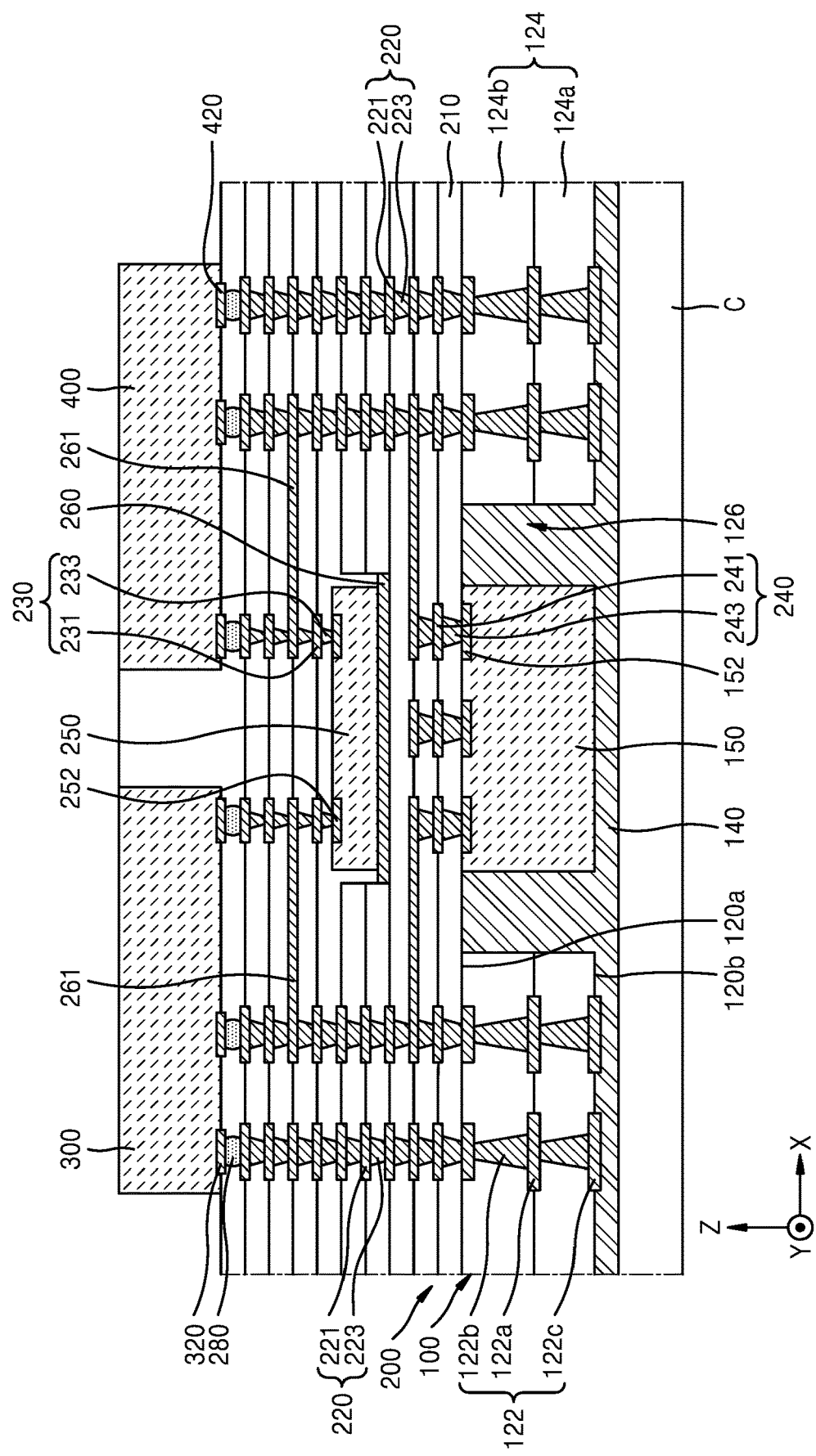
Figure 80:
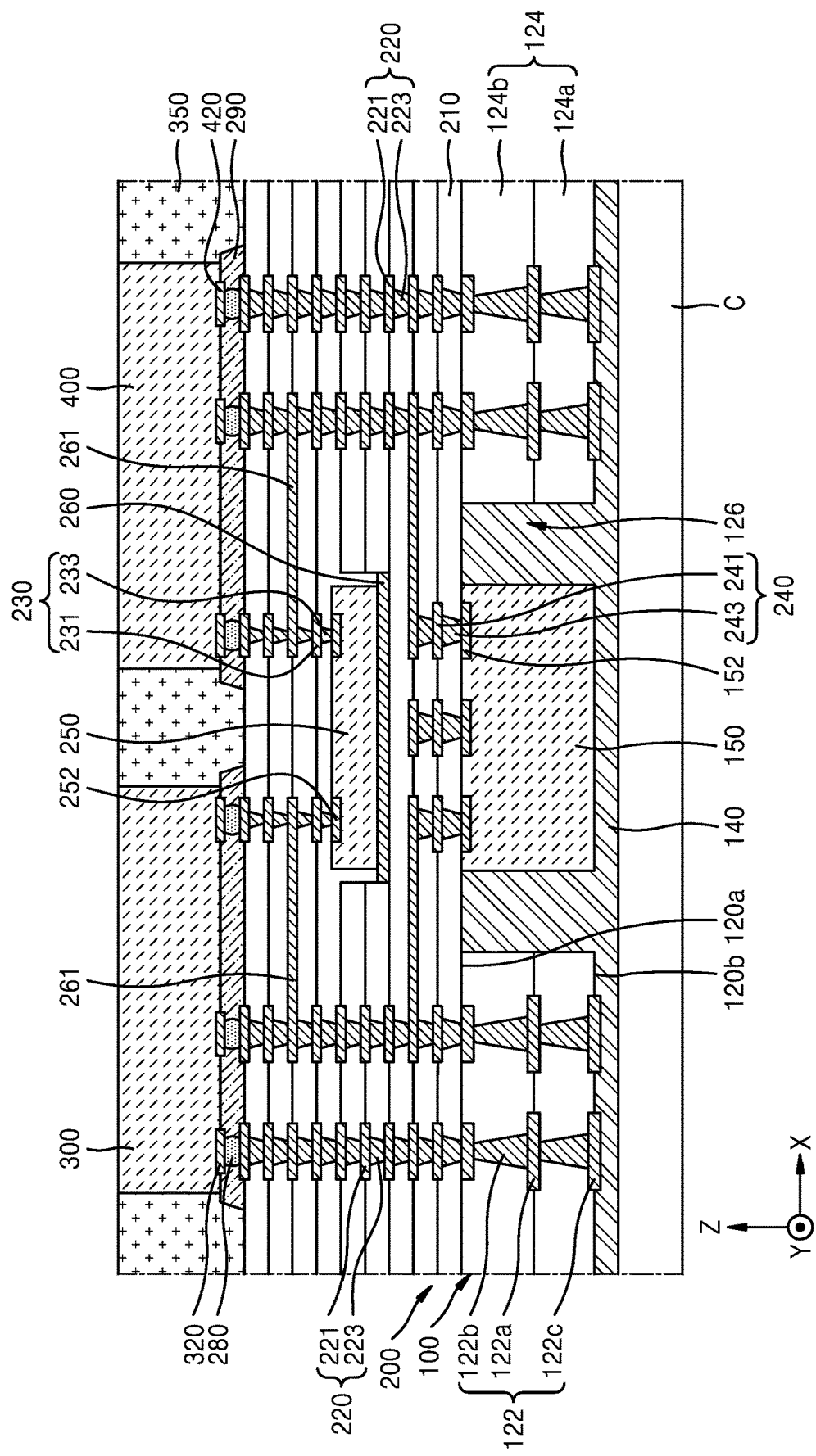
Figure 8P:
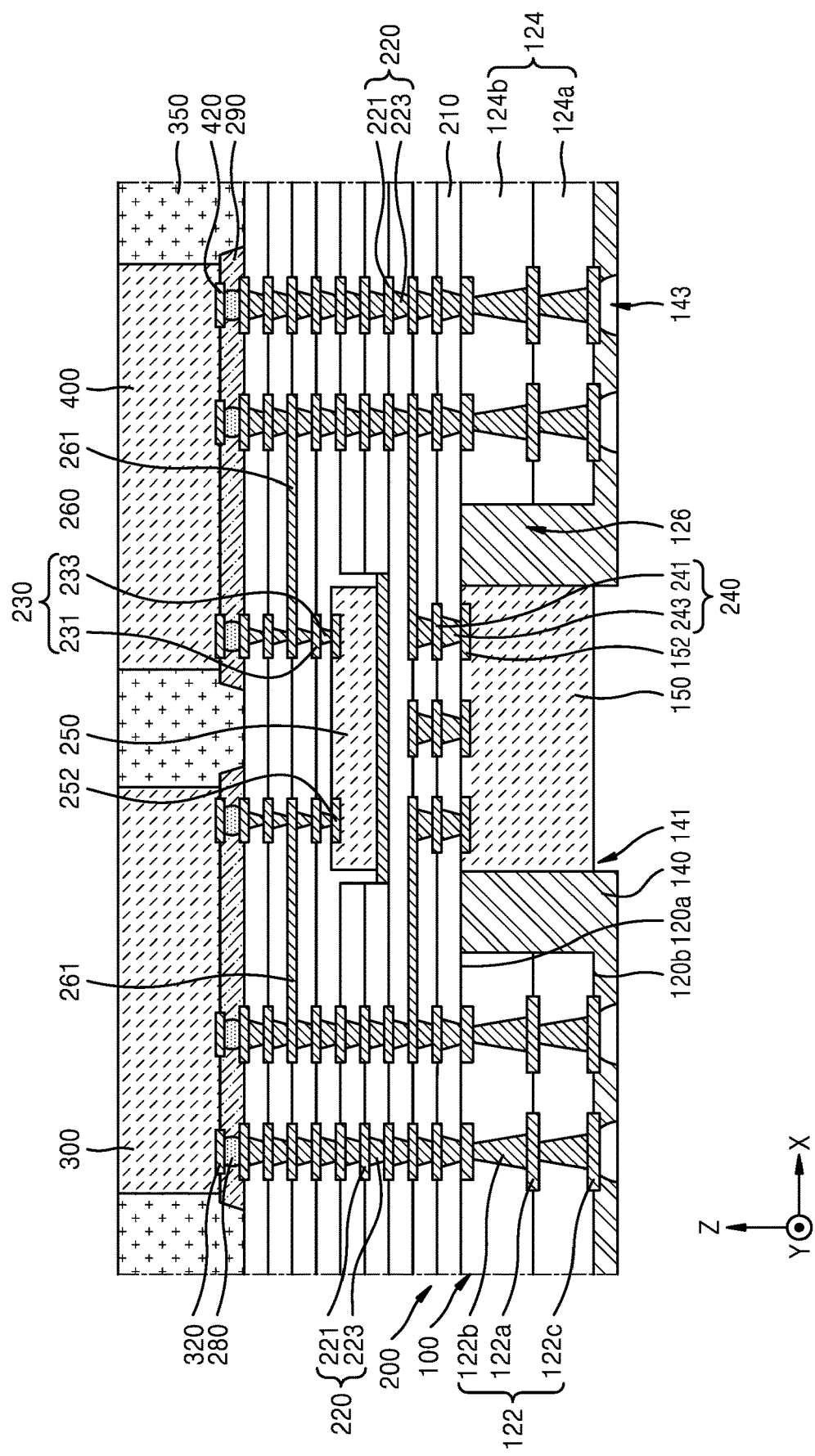
Figure 8Q:
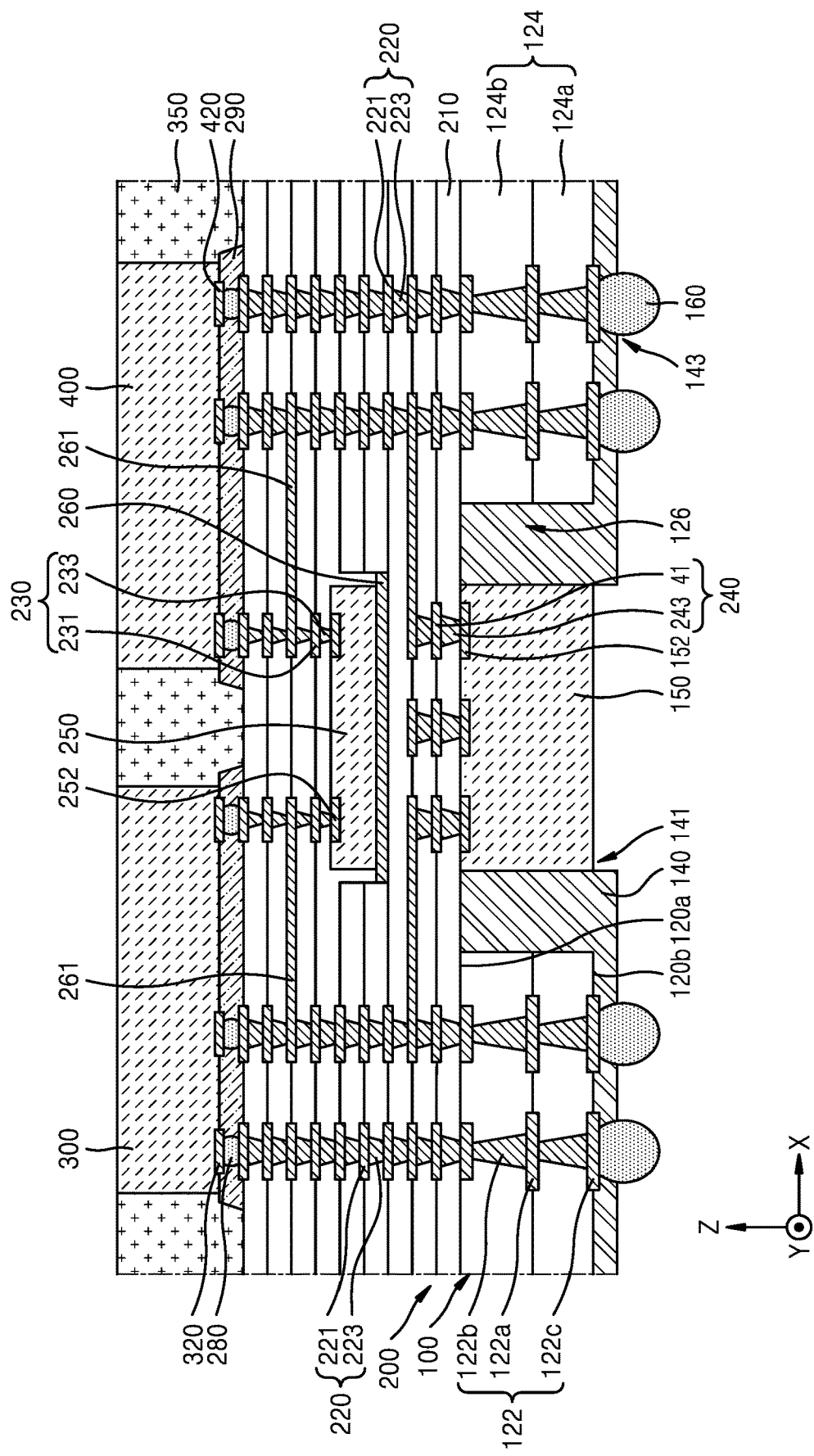
Figure 8R:
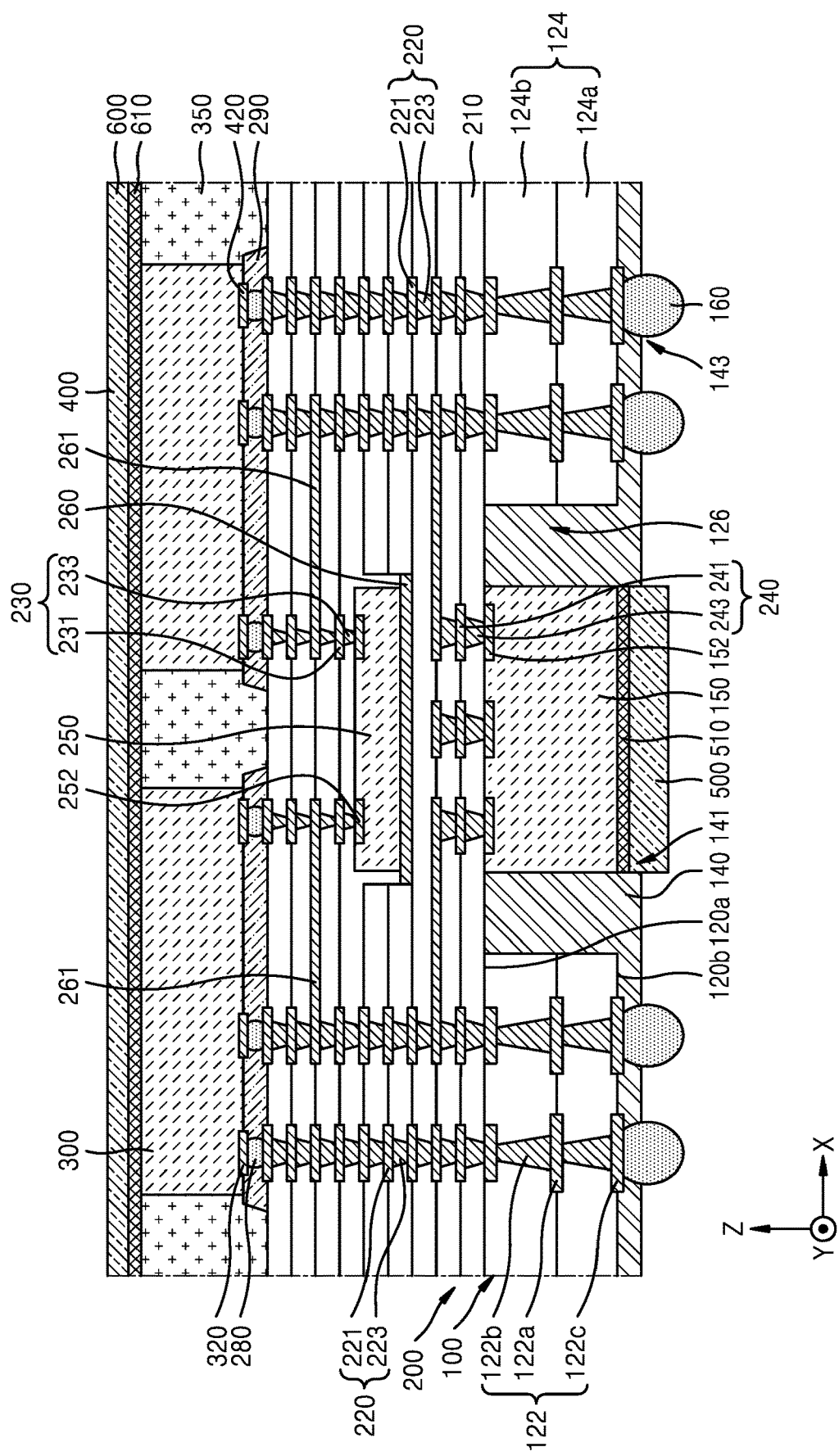

FIGS. 8A to 8R are diagrams for explaining a method of manufacturing a semiconductor package according to an embodiment. Hereinafter, a method of manufacturing the semiconductor package 15 illustrated in FIG. 6 will be described with reference to FIGS. 8A to 8R. In addition, content overlapping with that of the semiconductor package 15 illustrated in FIG. 6 will be omitted, and differences will be mainly described.

Referring to FIG. 8A, the first substrate 100 having a first surface 120a and a second surface 120b opposite to the first surface 120a, a wiring pattern 122 formed in the wiring insulating layer 124, and a cavity 126 formed in the central area of the first substrate 100 is prepared.

Referring to FIG. 8B, the barrier tape 130 is attached to the first surface 120a of the first substrate 100. While the barrier tape 130 is attached to the first surface 120a, a support on which a chip may be placed may be provided in the cavity 126 of the first substrate 100. Next, the first chip 150 is provided on the barrier tape 130. The first chip 150 may include a first chip pad 152 formed on the surface facing the barrier tape 130 from the first chip 150. Accordingly, the first chip 150 may be provided on the barrier tape 130 with the first chip pad 152 attached thereto.

Referring to FIG. 8C, a first molding member filling the upper surfaces of the first chip 150, the cavity 126, and the first substrate 100 is formed. To form the first molding member 140, an operation of forming an encapsulation material covering the first substrate 100, the first chip 150, and the cavity 126, and a polishing operation of flattening the fourth surface 140b of the first molding member 140 may be sequentially performed. The polishing process may include a planarization process such as a chemical mechanical polishing (CMP) process.

Referring to FIG. 8D, the structure of FIG. 8C is turned over, the carrier substrate c is attached to the fourth surface 140b of the first molding member 140, and the barrier tape 130 is removed.

Referring to FIG. 8E, a redistribution insulating layer 210 and a redistribution pattern are formed up to a predetermined layer on the first surface 120a of the first substrate 100, the third surface 140a of the first molding member 140, and the upper surface of the first chip 150. For example, the preset layer may have a lower vertical level than the uppermost redistribution insulating layer 210 stacked on the top of the redistribution structure 200.

Forming a lowermost redistribution insulating layer by applying a photosensitive polyimide film on the first surface 120a of the first substrate 100, forming an opening exposing the second chip pad 320 in the lowermost redistribution insulating layer, performing a metal wiring process of forming a redistribution via pattern filling the opening of the lowermost redistribution insulating layer and a redistribution line pattern extending along the upper surface of the lowermost redistribution insulating layer 210, and forming a redistribution insulating layer laminated in a vertical direction by applying a photosensitive polyimide film on the lowermost insulating layer may be repeated in turn, so that the redistribution layer may be stacked up to a certain level.

In this case, the redistribution pattern connected to the first chip 150 may be the third redistribution pattern 240, and the redistribution pattern connected to the wiring pattern 122 may be the first redistribution pattern 220. The third redistribution pattern 240 may be at a lower vertical level than the first redistribution pattern 220.

Referring to FIG. 8F, a stopper metal layer 260 is formed on the redistribution insulating layer stacked at the top in FIG. 8E. The stopper metal layer 260 may be formed in the central region. The stopper metal layer 260 may be formed through a plating method. For example, electroplating, electroless plating, or immersion plating methods may be used.

Referring to FIG. 8G, a redistribution insulating layer 210 and a redistribution pattern are additionally formed on the upper surface of the structure of FIG. 8F. At this time, only the redistribution insulating layer 210 is formed on the stopper metal layer 260. The method of forming the redistribution insulating layer 210 and the redistribution pattern is the same as or similar to the method described with reference to FIG. 8D, and thus will be omitted.

Referring to FIG. 8H, a redistribution insulating layer 210 is additionally formed on the upper surface of the structure of FIG. 8G. The method of forming the redistribution insulating layer 210 is the same as or similar to the method described with reference to FIG. 8D, and thus will be omitted.

Referring to FIG. 8I, the redistribution insulating layer 210 is removed so that the upper surface of the first redistribution line pattern 221 of the first redistribution pattern 220 stacked on the uppermost part of FIG. 8H is exposed. A lower portion of the redistribution insulating layer 210 may be removed using at least one of laser drilling, machining, and an etching process.

Referring to FIG. 8J, a portion of the redistribution insulating layer 210 is removed so that the upper surface of the stopper metal layer 260 is exposed from the upper surface of the structure of FIG. 8I. In this case, a recess 201 may be formed in the redistribution structure 200. The footprint of the redistribution insulating layer 210 to be removed may be equal to or smaller than the footprint of the stopper metal layer 260. The redistribution insulating layer 210 may be cured over time. In the process of removing a portion of the redistribution insulating layer 210, laser drilling may be used, but is not limited thereto, and machining may be used.

Referring to FIG. 8K, the bridge chip 250 is disposed on the stopper metal layer 260. The bridge chip 250 may include a bridge chip pad 252. The bridge chip pad 252 may be formed on the upper surface of the bridge chip 250.

Referring to FIG. 8L, a redistribution insulating layer 210 and a redistribution pattern are formed on the structure of FIG. 8K. The redistribution insulating layer 210 may be filled in the recess 201 of FIG. 8K. Through this, an interface extending in the vertical direction Z may be formed between the redistribution insulating layer 210 of FIG. 8K and the redistribution insulating layer of FIG. 8L.

The redistribution pattern connected to the bridge chip 250 may be formed as a second redistribution pattern 230, and a redistribution line pattern 261 connecting the second redistribution pattern 230 to the first redistribution pattern 220 may be formed.

Referring to FIGS. 8M and 8N, a redistribution structure 200 is formed, and a second chip 300 and a third chip 400 may be mounted on the upper surface of the redistribution structure 200.

Referring to FIG. 8O, a second molding member 350 surrounding the second chip 300 and the third chip 400 may be formed on the redistribution structure 200. To form the second molding member 350, an operation of forming an encapsulation material covering the second chip 300 and the third chip 400, and a polishing operation of flattening the upper surface of the second molding member 350 may be sequentially performed. The polishing process may include a planarization process such as a chemical mechanical polishing (CMP) process, and the upper surface of the second chip 300 and the upper surface of the third chip 400 may be exposed by the polishing operation.

Referring to FIGS. 8P and 8Q, the carrier substrate c is removed and a first opening 141 and a second opening 143 are formed in the first molding member 140. Next, the external connection bump 160 is attached to the wiring pattern 122 through the second opening 143. That is, the external connection bump 160 may be electrically connected to the wiring pattern 122 through the second opening 143.

Referring to FIG. 8R, the first heat dissipation member 500 is attached to the lower surface of the first chip 150 through the first opening 141 of the first molding member 140, and a second heat dissipation member 600 is attached to upper surfaces of the second chip 300 and the third chip 400. The first heat dissipation member 500 may be attached to the lower surface of the first chip 150 by the first TIM layer 510, and the second heat dissipation member 600 may be attached to the upper surfaces of the second chip 300 and the third chip 400 by the second TIM layer 610.

While the inventive concept has been particularly shown and described with reference to embodiments thereof, it will be understood that various changes in form and details may be made therein without departing from the spirit and scope of the following claims.

What is claimed is:

1. A semiconductor package comprising:
    a first substrate having a first surface and a second surface opposite to the first surface, comprising a wiring pattern, and having a cavity extending from the first surface to the second surface in a vertical direction;
    a first chip in the cavity of the first substrate;
    a redistribution structure on the first surface of the first substrate;
    a second chip on an upper surface of the redistribution structure;
    a third chip spaced apart from the second chip in a horizontal direction and disposed on an upper surface of the redistribution structure; and
    a bridge chip embedded in the redistribution structure and electrically connecting the second chip and the third chip,
    wherein the redistribution structure comprises:
        a first redistribution pattern electrically connecting the wiring pattern to the second chip, and electrically connecting the wiring pattern to the third chip;
        a second redistribution pattern electrically connecting the bridge chip to the second chip, and electrically connecting the bridge chip to the third chip; and
        a third redistribution pattern electrically connected to the first chip.

2. The semiconductor package of claim 1, wherein a line width of the first redistribution pattern is smaller than a line width of the wiring pattern, and
    wherein a line width of the second redistribution pattern is smaller than a line width of the first redistribution pattern.

3. The semiconductor package of claim 1, wherein the first chip comprises a logic chip, and
    wherein at least one of the second chip and the third chip comprises a memory chip.

4. The semiconductor package of claim 1, further comprising a first molding member surrounding the first chip.

5. The semiconductor package of claim 4, wherein a first opening is formed on a lower surface of the first molding member and exposes a lower surface of the first chip, and
    wherein the semiconductor package further comprises a first heat dissipation member attached to the lower surface of the first chip through the first opening.

6. The semiconductor package of claim 5, further comprising a first thermal interface material (TIM) layer between the lower surface of the first chip and the first heat dissipation member,
    wherein the first thermal interface material (TIM) layer is configured to attach the first heat dissipation member to the lower surface of the first chip.

7. The semiconductor package of claim 1, further comprising a second molding member surrounding the second chip and the third chip on the upper surface of the redistribution structure.

8. The semiconductor package of claim 7, wherein an upper surface of the second molding member, an upper surface of the second chip, and an upper surface of the third chip are located on a same plane, and
    wherein the semiconductor package further comprises a second heat dissipation member attached to the upper surface of the second molding member, the upper surface of the second chip, and the upper surface of the third chip.

9. The semiconductor package of claim 1, wherein the redistribution structure further comprises a stopper metal layer disposed between the bridge chip and the first chip, and
    wherein the stopper metal layer is configured to have resistance to a laser beam.

10. The semiconductor package of claim 9, wherein a footprint of the stopper metal layer is greater than a footprint of the bridge chip.

11. A semiconductor package comprising:
    a first substrate having a first surface and a second surface opposite to the first surface, comprising a wiring pattern and a wiring insulating layer surrounding the wiring pattern, and having a cavity extending from the first surface to the second surface in a vertical direction;
    a first chip in the cavity of the first substrate;
    a first molding member covering the second surface of the first substrate, the cavity, and the first chip;
    a redistribution structure on the first surface of the first substrate and an upper surface of the first molding member, and comprising a redistribution pattern and a redistribution insulating layer surrounding the redistribution pattern;
    a second chip on the upper surface of the redistribution structure;
    a third chip on the upper surface of the redistribution structure;
    a second molding member surrounding the second chip and the third chip on the upper surface of the redistribution structure; and
    a bridge chip in the redistribution structure and electrically connecting the second chip to the third chip.

12. The semiconductor package of claim 11, wherein the wiring insulation layer comprises a prepreg, and
    wherein the redistribution insulating layer comprises a Photo Imageable Dielectric (PID).

13. The semiconductor package of claim 11, wherein a first opening formed on a lower surface of the first molding member and exposes a lower surface of the first chip, and
    wherein an upper surface of the second chip, an upper surface of the third chip, and an upper surface of the second molding member are disposed on a same plane.

14. The semiconductor package of claim 13, further comprising:
    a first heat dissipation member attached to a lower surface of the first chip through the first opening; and
    a second heat dissipation member attached to an upper surface of the second chip and an upper surface of the third chip.

15. The semiconductor package of claim 14, further comprising:

a first thermal interface material (TIM) layer disposed between the lower surface of the first chip and the first heat dissipation member, and configured to attach the first heat dissipation member to the lower surface of the first chip; and a second thermal interface material (TIM) layer disposed between the upper surface of the second chip and the second heat dissipation member, and between the upper surface of the third chip and the second heat dissipation member, and configured to attach the second heat dissipation member to the upper surface of the second chip and the upper surface of the third chip.

16. The semiconductor package of claim 11, wherein the bridge chip further comprises a bridge chip pad on an upper surface of the bridge chip, and wherein the redistribution structure further comprises a stopper metal layer disposed between a lower surface of the bridge chip and the first chip, and configured to have resistance to a laser beam.

17. A semiconductor package comprising:

a first substrate having a first surface and a second surface opposite to the first surface, comprising a wiring pattern and a wiring insulating layer surrounding the wiring pattern, and a cavity extending from the first surface to the second surface in a vertical direction;

a first chip in the cavity of the first substrate;

a first molding member covering the second surface of the first substrate, the cavity, and a sidewall of the first chip, and comprising a first opening exposing a lower surface of the first chip;

a redistribution structure on the first surface of the first substrate and an upper surface of the first molding member, and comprising a redistribution pattern and a redistribution insulating layer surrounding the redistribution pattern;

a second chip on the upper surface of the redistribution structure;

a third chip on the upper surface of the redistribution structure;

a second molding member surrounding sidewalls of the second chip and the third chip, and having an upper surface positioned on a same plane as an upper surface of the second chip and an upper surface of the third chip;

a first heat dissipation member attached to a lower surface of the first chip through the first opening;

a second heat dissipation member on an upper surface of the second chip, an upper surface of the third chip, and an upper surface of the second molding member; and a bridge chip embedded in the redistribution structure and electrically connecting the second chip to the third chip, wherein the redistribution structure comprises:

a first redistribution pattern electrically connecting the wiring pattern to the second chip and the third chip;

a second redistribution pattern electrically connecting the bridge chip to the second chip and the third chip; and a third redistribution pattern electrically connected to the first chip.

18. The semiconductor package of claim 17, wherein the wiring insulating layer comprises a prepreg, wherein the redistribution insulating layer comprises a Photo Imageable Dielectric (PID), wherein a line width of the first redistribution pattern is smaller than a line width of the wiring pattern, and wherein a line width of the second redistribution pattern is smaller than a line width of the first redistribution pattern.

19. The semiconductor package of claim 17, further comprising:

a first thermal interface material (TIM) layer disposed between the lower surface of the first chip and the first heat dissipation member, and configured to attach the first heat dissipation member to the lower surface of the first chip; and a second thermal interface material (TIM) layer between an upper surface of the second chip, an upper surface of the third chip, and an upper surface of the second molding member and the second heat dissipation member, wherein the second thermal interface material (TIM) layer is configured to attach the second heat dissipation member to an upper surface of the second chip, an upper surface of the third chip, and an upper surface of the second molding member.

20. The semiconductor package of claim 17, wherein the redistribution structure further comprises a stopper metal layer between a lower surface of the bridge chip and the first chip, wherein the stopper metal layer is configured to have resistance to a laser beam, and wherein a footprint of the stopper metal layer is greater than a footprint of the bridge chip.

* * * * *